United States Patent
Chen et al.

(10) Patent No.: US 12,237,321 B2
(45) Date of Patent: Feb. 25, 2025

(54) FILLER CELL REGION WITH CENTRALLY UNCUT GATE SEGMENTS, SEMICONDUCTOR DEVICE INCLUDING SAME AND METHOD OF MANUFACTURING SAME

(71) Applicant: TAIWAN SEMICONDUCTOR MANUFACTURING COMPANY, LTD., Hsinchu (TW)

(72) Inventors: Shun Li Chen, Hsinchu (TW); Fei Fan Duan, Hsinchu (TW); Ting Yu Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 426 days.

(21) Appl. No.: 17/843,770

(22) Filed: Jun. 17, 2022

(65) Prior Publication Data

US 2023/0260985 A1     Aug. 17, 2023

Related U.S. Application Data

(60) Provisional application No. 63/311,355, filed on Feb. 17, 2022.

(51) Int. Cl.
*H01L 27/02* (2006.01)
*H01L 21/8234* (2006.01)
*H01L 27/118* (2006.01)

(52) U.S. Cl.
CPC .. *H01L 27/0207* (2013.01); *H01L 21/823437* (2013.01); *H01L 27/11807* (2013.01)

(58) Field of Classification Search
CPC ......... H01L 27/0207; H01L 21/823437; H01L 27/11807; H01L 27/088; H01L 29/42356; H01L 21/823431; H01L 27/0886; H01L 29/0684; H01L 29/66795; H01L 29/785
See application file for complete search history.

(56) References Cited

U.S. PATENT DOCUMENTS

2020/0388540 A1    12/2020  Gu et al.
2021/0320065 A1*   10/2021  Date ................. H01L 27/092
2023/0040733 A1*   2/2023   Yu ................... H01L 27/0886

FOREIGN PATENT DOCUMENTS

TW        202020987        6/2020

* cited by examiner

*Primary Examiner* — Mohammed R Alam
(74) *Attorney, Agent, or Firm* — Hauptman Ham, LLP

(57) ABSTRACT

A filler cell region (in a semiconductor device) includes: gate segments, a majority of first ends of which substantially align with a first reference line that parallel and proximal to a top boundary of the filler cell region, and a majority of second ends of which substantially align with a second reference line that is parallel and proximal to a bottom boundary of the filler cell region. First and second gate segments extend continuously across the filler cell region; and third & fourth and fifth & sixth gate segments are correspondingly coaxial and separated by corresponding gate-gaps. Relative to the first direction: a first end of the first gate segment extends to the top boundary of the filler cell region; and a second end of the second gate segment extends to the bottom boundary of the filler cell region.

20 Claims, 18 Drawing Sheets

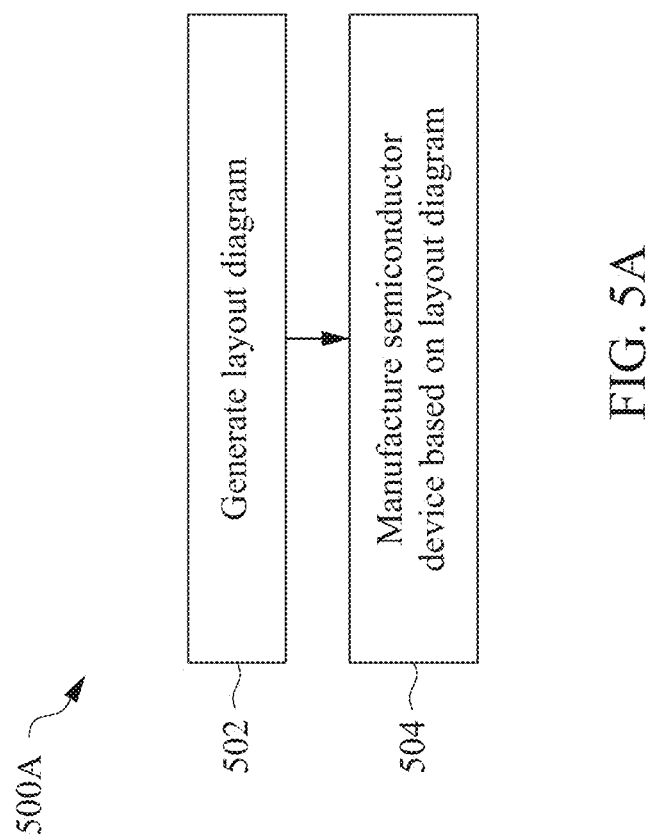

512
Form ARs of filler cell region including doping corresponding areas of substrate

514
Form gate segments of filler cell region over corresponding ones of the ARs such that
1st and 2nd gate segments extend continuously across filler cell region,
majority of 1st ends of gate segments align proximal to 1st boundary of filler cell region,
majority of 2nd ends of gate segments align proximal to 2nd boundary of filler cell region,
1st end of 1st gate segment aligns with 1st boundary of filler cell region, and
2nd end of 2nd gate segment aligns with 2nd boundary of filler cell region

516
Form/Route metallization segments through filler cell region

FILLER CELL REGION WITH CENTRALLY UNCUT GATE SEGMENTS, SEMICONDUCTOR DEVICE INCLUDING SAME AND METHOD OF MANUFACTURING SAME

BACKGROUND

The integrated circuit (IC) industry produces a variety of analog and digital semiconductor devices to address issues in different areas. Developments in semiconductor process technology nodes have progressively reduced component sizes and tightened spacing resulting in progressively increased transistor density. ICs progressively become smaller.

A filler cell region, as referred to herein, includes active regions and gate segments. The gate segments of a filler cell are free from electrical coupling to active or passive circuitry within the filler cell region. For example, consider first and second transistor regions different dopant concentrations (to yield different threshold voltages) that otherwise would be adjoining: filler cell regions are used to separate the first and second regions and thereby reduce if not eliminate dopant contamination between the first and second regions.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 5A is a flow diagram of a method of manufacturing a semiconductor device, in accordance with some embodiments.

FIG. 5B is a method of fabricating a semiconductor device, in accordance with some embodiments.

DETAILED DESCRIPTION

Figure 1:
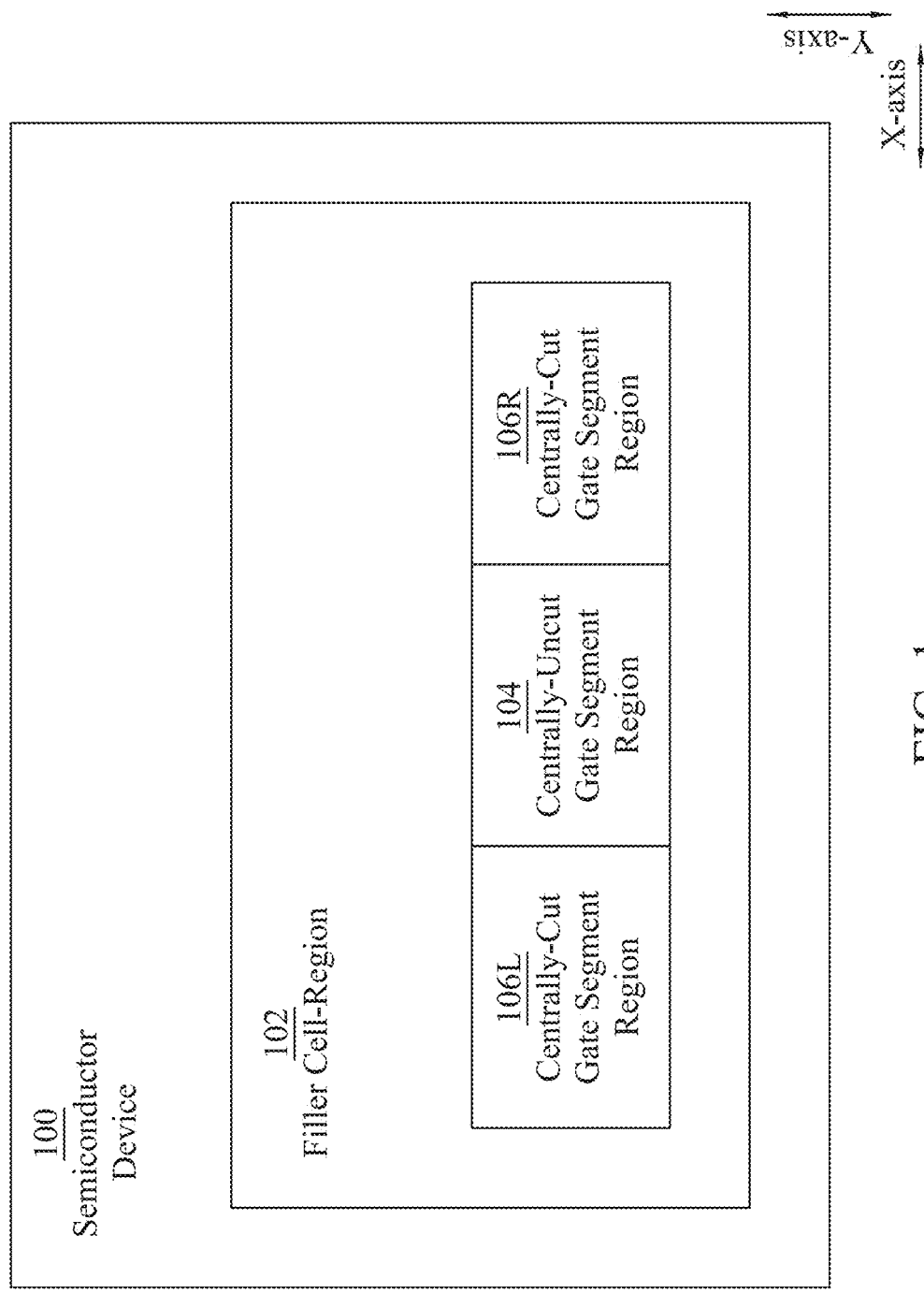
FIG. 1 is a block diagram of a semiconductor device, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a semiconductor device includes a filler cell region including gate segments extending in a first direction (e.g., the Y-axis) and being free from electrical coupling to active or passive circuitry within the filler cell region. The filler cell region includes a centrally-uncut gate region between first and second centrally-cut gate regions. Relative to the Y-axis: a majority of first ends of the gate segments substantially align with a first reference line that is parallel and proximal to a top boundary of the filler cell region; and a majority of second ends of the gate segments substantially align with a second reference line that is parallel and proximal to a bottom boundary of the filler cell region. In the centrally-uncut gate region, first and second ones of the gate segments extend continuously across the filler cell region. Third & fourth ones of the gate segments are correspondingly coaxial and separated by a corresponding gate-gap located centrally in the first centrally-cut gate region. Fifth & sixth ones of the gate segments are correspondingly coaxial and separated by a corresponding gate-gap located centrally in the second centrally-cut gate region. Relative to the Y-axis: a first end the first gate segment extends to the top boundary; and a second end of the second gate segment extends to the bottom boundary.

A filler cell region according to another approach is a counterpart of the filler cell region of some present embodiments, that latter including a centrally-uncut gate region between first and second centrally-cut gate regions. Relative to the Y-axis, all gate segments in the filler cell region according to the other approach are separated by a gate-gap, i.e., none of the gate segments is continuous in a central area of the filler cell region, which impedes routability. By contrast, relative to the Y-axis, at least some of the gate segments of the filler cell region of at least some present embodiments are continuous in a central area of the filler cell region, which facilitates routability as compared to the filler cell region according to the other approach.

FIG. 1 is a block diagram of a semiconductor device 100, in accordance with some embodiments.

Semiconductor device 100A includes a filler cell region 102. Filler cell region 102 includes regions 104, 106L and 106R. Relative to a first direction, e.g., parallel to the X-axis, region 104 is between regions 106L and 106R.

Relative to a second direction perpendicular to the first direction, e.g., relative to the Y-axis, region 104 has gate segments which are continuous, i.e., not split, in a central area of filler cell region 102 (see FIGS. 2A-2F, 3B, 4A-4B). In some embodiments, region 104 is described as a centrally-uncut gate region.

Relative to the Y-axis, each of regions 106L and 106R has gate segments which are split, i.e., which are not continuous, in the central area of filler cell region 102 (see FIGS. 2A-2F, 3A, 4A-4B). In some embodiments, each of regions 106L and 106R is described as a centrally-cut gate region.

Figure 2A:
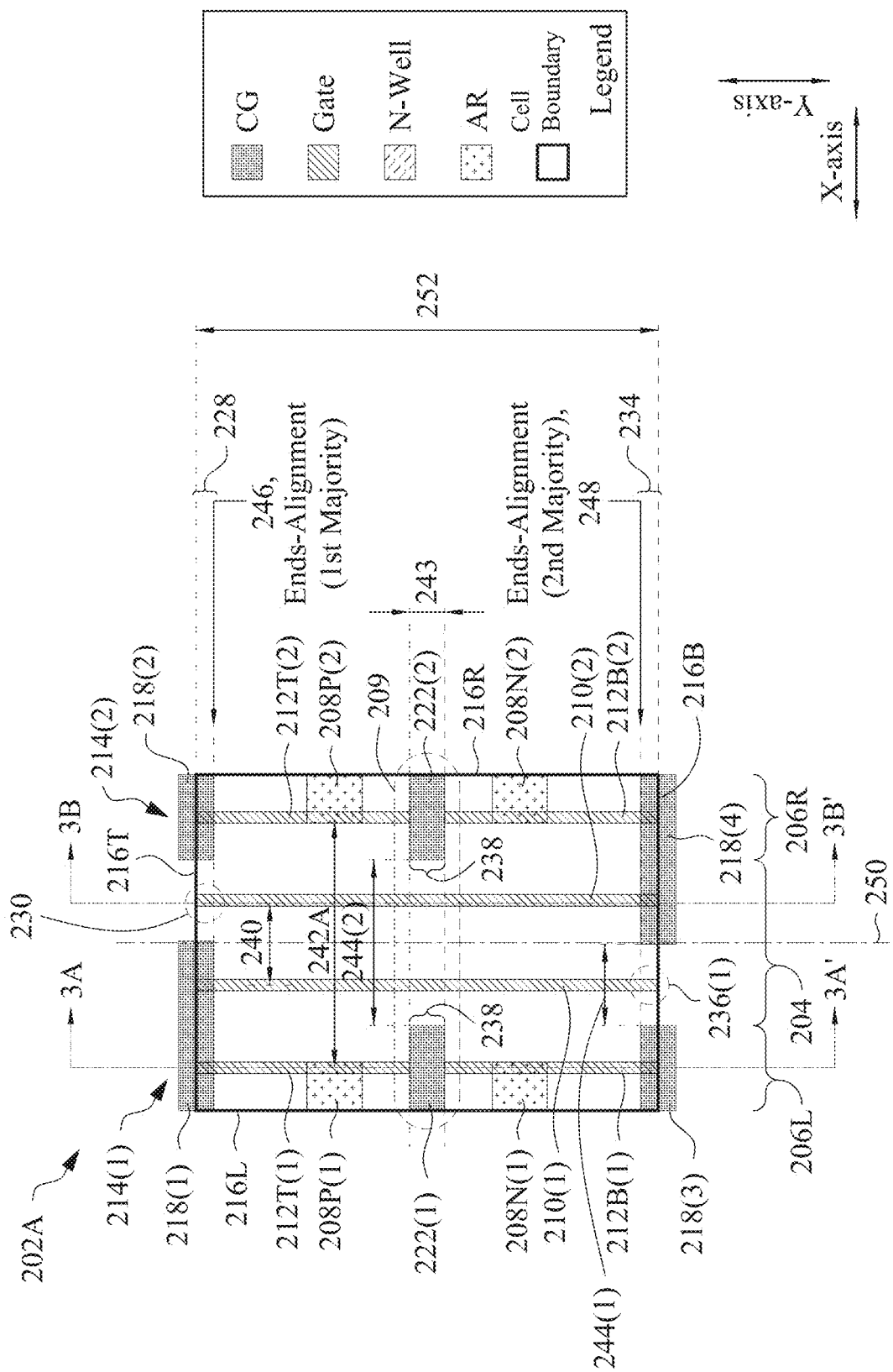
FIGS. 2A-2F are layout diagrams, in accordance with some embodiments.

FIG. 2A is a layout diagram of a filler cell region 202A, in accordance with some embodiments.

In general, a layout diagram represents a semiconductor device. Shapes in the layout diagram represent corresponding components in the semiconductor device. The layout diagram per se is a top view. Shapes in the layout diagram are two-dimensional relative to, e.g., the X-axis and the Y-axis, whereas the semiconductor device being represented is three-dimensional. Typically, relative to the Z-axis, the semiconductor device is organized as a stack of layers in which are located corresponding structures, i.e., to which belong corresponding structures. Accordingly, each shape in the layout diagram represents, more particularly, a component in a corresponding layer of the corresponding semiconductor device. Typically, the layout diagram represents relative depth, i.e., positions along the Z-axis, of shapes and thus layers by superimposing a second shape on a first shape so that the second shape at least partially overlaps the first shape. For simplicity of discussion, i.e., as a discussion-expedient, some elements in layout diagram (e.g., FIG. 2A and the other layout diagrams disclosed herein) are referred to as if they are counterpart structures in a corresponding semiconductor device rather than patterns/shapes per se.

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers of the corresponding semiconductor device are represented, i.e., selected layers of the layout diagram are omitted, e.g., for simplicity of illustration. FIG. 2A and the other layout diagrams disclosed herein are examples of layout diagrams in which selected layers have been omitted, e.g., metallization layers & corresponding interconnection beginning with a first level of metallization are omitted in FIG. 2B. In some embodiments, the layout diagram of FIG. 2A is part of a larger layout diagram.

In FIG. 2A, buffer cell region 202A includes active regions (ARs) 208P(1), 208P(2), 208N(1) and 208N(2). In a context of field-effect transistor (FET) technology, portions of ARs 208P(1)-208P(2) comprise parts of positive-channel metal oxide semiconductor (PMOS) FETs (PFETs), and portions of ARs 208N(1)-208N(2) comprise parts of negative-channel metal oxide semiconductor (NMOS) FETs (NFETs). Each of ARs 208P(1)-208P(2) and 208N(1)-208N(2) has a long axis that extends in a first direction, e.g., parallel to the X-axis. The long axes of ARs 208P(1) and 208P(2) are coaxial. The long axes of ARs 208N(1)-208N(2) are coaxial. Each of ARs 208P(1)-208P(2) and 208N(1)-208N(2) has a short axis that extends in a second direction perpendicular to the first direction, e.g., the second direction being parallel to the Y-axis.

In some embodiments (not shown), relative to the X-axis: the second end of AR 208P(1) and/or AR 208N(1) extends beyond, i.e., outside, a left boundary 216L (discussed below) of filler cell region 202A into an adjacent cell region (not shown); and/or the second end of AR 208P(2) and/or AR 208N(2) extends beyond, i.e., outside, a right boundary 216R (discussed below) of filler cell region 202A into an adjacent cell region (not shown).

In FIG. 2A, relative to the X-axis: ARs 208P(1) and 208P(2) are separated by an AR-gap 242A; and ARs 208N(1) and 208N(2) are separated by AR-gap 242A. In some embodiments, the size of AR-gap 242A is approximately an integer multiple of CPP, where CPP is a unit of measure discussed below. In FIG. 2A, the size of AR-gap 242A is approximately 3.0 CPP. In some embodiments, AR-gap 242A has a size other than approximately 3.0 CPP.

In FIG. 2A and in other layout diagrams disclosed herein, relative to the Y-axis, a distance or size is alternately referred to as a height. Each of ARs 208P(1)-208P(2) and 208N(1)-208N(2) has a height. Relative to the Y-axis, coaxial ARs 208P(1) & 208P(2) are spaced apart from coaxial ARs 208N(1) & 208N(2) by a gap. Sizes of the height of ARs 208P(1)-208P(2) and 208N(1)-208N(2) and of the gap (relative to the Y-axis) are determined by corresponding design rules of the corresponding semiconductor process technology node.

In some embodiments, the FET technology is a fin-type FET (fin-FET) technology. In some embodiments, the FET technology is gate-all-around-type FET (GAAFET) technology, e.g., which uses nanowire, nanosheets, or the like. In some embodiments, the FET technology is complementary FET (CFET) technology. In some embodiments, the FET technology represents a transistor technology other than fin-FET, GAAFET, CFET, or the like.

In FIG. 2A, buffer cell region 202A includes gate segments 210(1), 210(2), 212T(1), 212T(2), 212B(1) and 212B(2), each of which has a long axis extending parallel to the Y-axis. Gate segments 212T(1) and 212B(1) are collinear and represent a dyad 214(1) of gate segments. Gate segments 212T(2) and 212B(2) are collinear and represent a dyad 214(2) of gate segments. Relative to the X-axis: gate segments 210(1)-210(2) are between dyad 214(1) and dyad 214(2); gate segment 210(1) is between dyad 214(1) and gate segment 210(2); and gate segment 210(2) is between gate segment 210(1) and dyad 214(2).

Because cell region 202A is a filler cell region, gate segments 210(1)-210(2), 212T(1)-212T(2) and 212B (1)-212B (2) are free from electrical coupling to active or passive circuitry within filler cell region 202A.

Relative to the X-axis: first ends of ARs 208P(1)-208P(2) and 208N(1)-208N(2) extend towards the interior of filler cell region 202A; the first end of AR 208P(1) substantially aligns with a midline of gate segment 212T(1); the first end of AR 208N(1) substantially aligns with a midline of gate segment 212B(1); the first end of AR 208P(2) substantially aligns with a midline of gate segment 212T(2); the first end of AR 208N(2) aligns with a midline of gate segment 212B(2); second ends of ARs 208P(1) and 208N(1) substantially align with left boundary 216L of filler cell region 202A; and second ends of ARs 208P(2) and 208N(2) substantially align with right boundary 216R of filler cell region 202A.

Relative to the X-axis, a distance 240 between two immediately adjacent ones of the gate segments is uniform and approximately 1.0 CPP, where CPP is a unit of distance-measure. In some embodiments, CCP is an acronym for contacted poly pitch. A value for CPP is determined by the design rules and scale of the corresponding semiconductor process technology node.

In FIG. 2A, left boundary 216L of filler cell region 202A is parallel and proximal to midlines of gate segments 212T (1) and 212B(1). In some embodiments, relative to the X-axis, a distance between left boundary 216L and the midlines of gate segments 212T(1) and 212B(1) is approximately an integer multiple of CPP. In FIG. 2A, the distance between left boundary 216L and the midlines of gate segments 212T(1) and 212B(1) is approximately 0.5 CPP. In some embodiments, left boundary 216L is separated from the midlines of gate segments 212T(1) and 212B(1) by a distance other than approximately 0.5 CPP.

In FIG. 2A, right boundary 216R of filler cell region 202A is parallel and proximal to midlines of gate segments 212T(2) and 212B(2). In some embodiments, relative to the X-axis, a distance between right boundary 216R and the midlines of gate segments 212T(2) and 212B(2) is approximately an integer multiple of CPP. In FIG. 2A, the distance between right boundary 216R and the midlines of gate segments 212T(2) and 212B(2) is approximately 0.5 CPP. In some embodiments, right boundary 216R is separated from the midlines of gate segments 212T(2) and 212B(2) by a distance other than approximately 0.5 CPP.

The layout diagram of FIG. 2A further includes cut-gate (CG) shapes 218(1)-218(4) and 222(1)-222(2), each of which has a long axis extending parallel to the X-axis. In general, where a subject pattern underlies a given cut pattern such that a portion of the subject pattern is overlapped by the given cut pattern, the given cut pattern is used to indicate that the overlapped portion of the subject pattern eventually will be removed during fabrication of a corresponding semiconductor device. The subjects of CG patterns 218(1)-218(4) and 222(1)-222(2) are corresponding underlying portions of gate segments 210(1)-210(2), 212T(1)-212T(2) and 212B(1)-212B(2).

In FIG. 2A, CG shapes 218(1) and 218(2) are collinear. In some embodiments, CG shapes 218(1) and 218(2) underlie a first conductive segment (not shown in FIG. 2A but see FIGS. 3A-3B) in a first layer of metallization (a first M_1st segment in the M_1st layer). The first M_1st segment has a long axis parallel to the X-axis and is designated for a first reference voltage, e.g., VDD. In some embodiments, the first M_1st segment is described as a power grid (PG) segment. In such embodiments, CG shapes 218(1) and 218(2) are described as being PG-local CG shapes.

Relative to the Y-axis, CG shape 218(1) overlies outer ends 228 of gate segments 212T(1) and 210(1), and CG shape 218(2) overlies outer end 228 of gate segment 212T(2). As a result of CG shapes 218(1)-218(2), outer ends 228 of gate segments 212T(1), and 210(1) and 212T(2) substantially align (relative to the Y-axis) with a reference line 246. Reference line 246 is parallel and proximal to a top boundary 216T of filler cell region 202A. Relative to a total number of ends 228, a majority of the total number of ends 228 align with reference line 246. In some embodiments, top boundary 216T is substantially collinear with midlines of CG shapes 218(1) and 218(2). In some embodiments, top boundary 216T is substantially collinear a midline of the first M_1st segment.

In FIG. 2A, relative to the X-axis: CG shapes 218(1) and 218(2) are separated by a CG-gap 244(1); and CG shapes 218(3) and 218(4) are separated by CG-gap 244(1) and CG shapes 222(1) and 222(2) are separated by a gap 244(2). In some embodiments, the size of CG-gap 244(1) is approximately an integer multiple of CPP. In FIG. 2A, the size of CG-gap 244(1) is approximately 1.0 CPP. In some embodiments, CG-gap 244(1) has a size other than approximately 1.0 CPP.

Due to corresponding CG-gap 244(1), outer end 228 of gate segment 210(2) is not covered by a CG shape. As a result, outer end 228 of gate segment 210(2) aligns with top boundary 216T in an escape area 230. Relative to the Y-axis, outer end 228 of gate segment 210(2) extends farther away from central area 209 than outer ends 228 of gate segments 212T(1), 210(1) and 212T(2). In some embodiments (not shown), relative to the Y-axis, gate segment 210(2) is extended beyond, i.e., outside, top boundary 216T into an adjacent cell region (not shown). In some embodiments, a gate segment which extends beyond, i.e., outside, the filler cell boundary is described as an escaping gate segment. In such embodiments, because outer end 228 of gate segment 210(2) aligns with top boundary 216T, outer end 228 of gate segment 210(2) is described as an escapable type of outer end 228.

In FIG. 2A, CG shapes 218(3) and 218(4) are collinear. In some embodiments, CG shapes 218(3) and 218(4) underlie a second M_1st segment (not shown in FIG. 2A but see FIGS. 3A-3B). The second M_1st segment has a long axis parallel to the X-axis and is designated for a second reference voltage, e.g., VSS. In some embodiments, the second M_1st segment is described as a PG segment. In such embodiments, CG shapes 218(3) and 218(4) are described as being PG-local CG shapes.

CG shape 218(3) overlies outer end 234 of gate segment 212B(1), and CG shape 218(4) overlies outer ends 234 of gate segments 210(2) and 212B(2). As a result of CG shapes 218(3)-218(4), outer ends 234 of gate segments 212B(1), 210(2) and 212B(2) substantially align (relative to the Y-axis) with a reference line 248. Reference line 248 is parallel and proximal to a bottom boundary 216B of filler cell region 202A. Relative to a total number of ends 234, a majority of the total number of ends 234 align with reference line 248. In some embodiments, bottom boundary 216B is substantially collinear with midlines of CG shapes 218(3) and 218(4). In some embodiments, bottom boundary 216B is substantially collinear a midline of the second M_1st segment. Relative to the Y-axis, region 204 has gate segments which are continuous, i.e., not split, in central area 209. As such, in some embodiments, region 204 is described as a centrally-uncut gate region.

Due to corresponding CG-gap 244(1), outer end 234 of gate segment 210(1) is not covered by a CG shape. As a result, outer end 234 of gate segment 210(1) aligns with bottom boundary 216B in an escape area 236(1). Relative to the Y-axis, outer end 234 of gate segment 210(1) extends farther away from central area 209 than outer ends 234 of gate segments 212B(1), 210(2) and 212B(2). In some embodiments (not shown), relative to the Y-axis, gate segment 210(2) extends beyond bottom boundary 216B into an adjacent cell region (not shown). In some embodiments, because outer end 234 of gate segment 210(1) aligns with bottom boundary 216B, outer end 234 of gate segment 210(1) is described as an escapable type of outer end 234.

Relative to the X-axis, escape area 230 does not align with escape area 236(1). Escape areas 230 and 236(1) are on opposite sides of a midline 250 of filler cell region 202A, the latter being parallel to the Y-axis, Accordingly, the locations of escape areas 230 and 236(1) represent an asymmetric aspect of filler cell region 202A with respect to midline 250. In some embodiments, midline 250 represents an axis of rotation, and filler cell region 202A is rotated 180 degrees about midline 250.

In FIG. 2A, CG shapes 222(1) and 222(2) are collinear. Relative to the Y-axis, CG shapes 222(1) and 222(2) are in a gap between collinear ARs 208P(1) and 208P(2) and collinear ARs 208N(1) and 208N(2). In some embodiments, relative to the Y-axis, the gap between collinear ARs 208P(1)

and 208P(2) and collinear ARs 208N(1) and 208N(2) is described as the P/N gap. In some embodiments, CG shapes 222(1) and 222(2) are coaxial with a PN-midline of the P/N gap. In such embodiments, CG shapes 222(1) and 222(2) are described as being PN-midline-local shapes.

CG shape 222(1) overlies inner ends 238 of gate segment 212B(1), and CG shape 218(4) overlies inner ends 238 of gate segments 210(2) and 212B(2). As a result of CG shape 222(1), inner ends 238 of gate segments 212B(1) and 212T(1) are separated by a gate-gap 243 relative to the Y-axis. Gate segments 212B(1) and 212T(1) are split, i.e., are not continuous, in central area 209 of filler cell region 102. As a result of CG shape 222(2), inner ends 238 of gate segments 212B(2) and 212T(2) are separated by gate-gap 243. Gate segments 212B(2) and 212T(2) are split, i.e., are not continuous, in central area 209. Relative to the Y-axis, each of regions 206L and 206R has gate segments which are split, i.e., which are not continuous, in central area 209. As such, in some embodiments, each of regions 206L and 206R is described as a centrally-cut gate region.

A filler cell region according to another approach is a counterpart of filler cell region 202A. Relative to the Y-axis, all gate segments in the filler cell region according to the other approach are separated by a gate-gap, i.e., none of the gate segments is continuous in a central area of the filler cell region, which impedes routability. Relative to the Y-axis, all ends of the gate segments in the filler cell region according to the other approach extend the same distance from the central area of the filler cell region. By contrast, relative to the Y-axis, outer end 234 of gate segment 210(1) extends farther away from central area 209 than outer ends 234 of gate segments 212B(1), 210(2) and 212B(2), which facilitates routability. By contrast, gate segments 210(1) and 210(2) of filler cell region 202A are continuous in central area 209, which facilitates routability as compared to the filler cell region according to the other approach. Also, by contrast, escapable type outer end 228 of gate segment 210(2) and/or escapable type outer end 234 of gate segment 210(1) is extendable into a corresponding adjacent cell region (not shown), which facilitates routability as compared to the filler cell region according to the other approach.

In some embodiments, an instance of a gate segment, e.g., gate segment 212T(1), 212B(1), 212T(2) and/or 212B(2) is replaced by an isolation dummy gate (IDG) (not shown). An isolation dummy gate, such as that created from an isolation dummy gate pattern (not shown), is a dielectric structure that includes one or more dielectric materials and functions as an electrical isolation structure. Accordingly, an isolation dummy gate is not a structure that is electrically conductive and so does not function, e.g., as a gate electrode of an active transistor. In some embodiments, an isolation dummy gate is referred to as a dielectric gate structure. In some embodiments, an isolation dummy gate is an example of a structure included in CPODE layout scheme. In some embodiments, CPODE is an acronym for continuous poly on diffusion edge. In some embodiments, CPODE is an acronym for continuous poly on oxide definition edge. In some embodiments, an isolation dummy gate is based on a gate structure as a precursor. In some embodiments, an isolation dummy gate is formed by first forming a gate structure, e.g., a dummy gate structure, sacrificing/removing (e.g., etching) the gate structure to form a trench, (optionally) removing a portion of a substrate that previously had been under the gate structure to deepen the trench, and then filling the trench with one or more dielectric materials such that the physical dimensions of the resultant electrical isolation structure, i.e., the isolation dummy gate, are similar to the dimensions of the precursor which was sacrificed, namely the gate structure or the combination of the gate structure and the portion of the substrate.

Figure 2B:
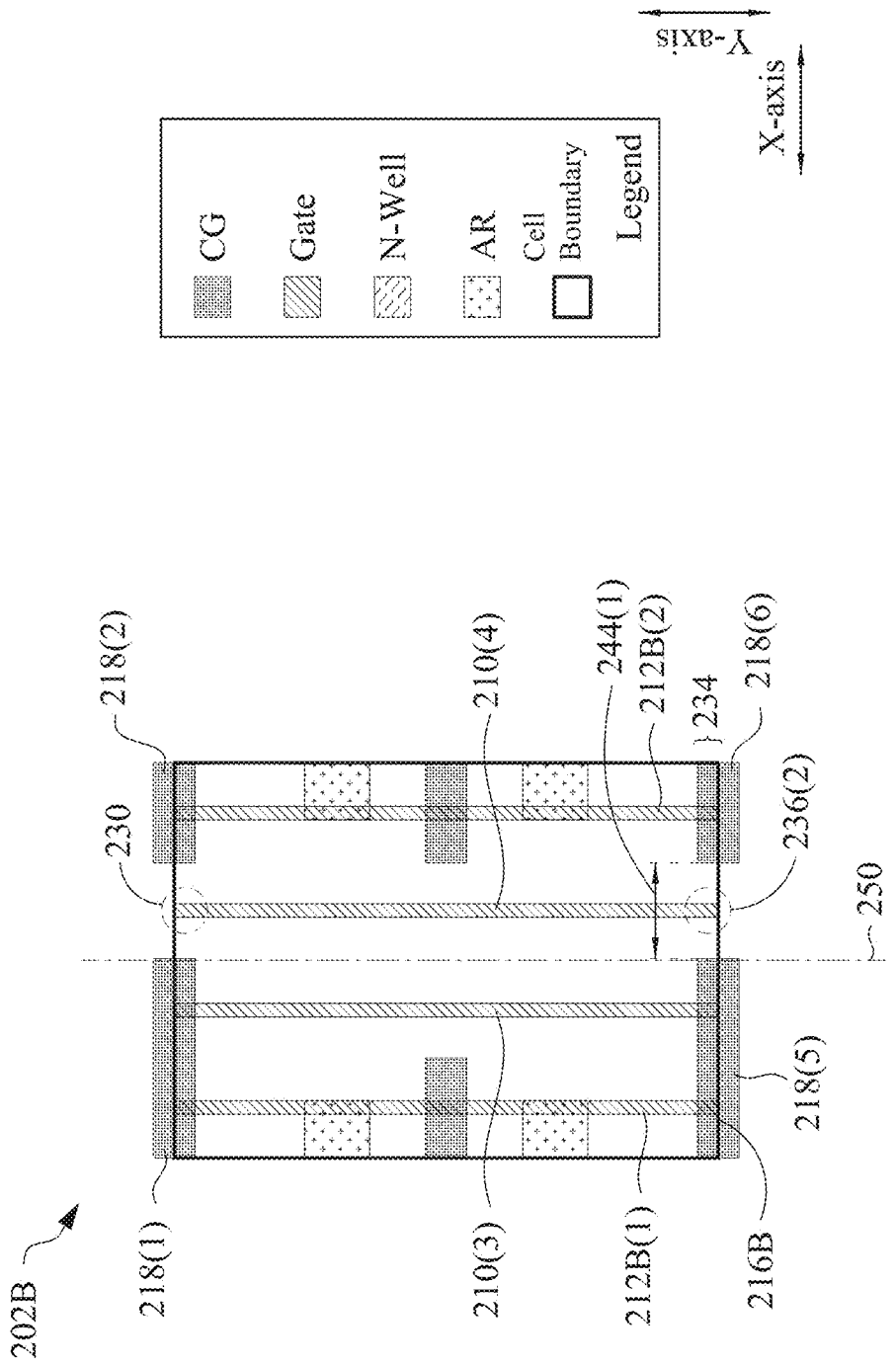

FIG. 2B is a layout diagram of a filler cell region 202B, in accordance with some embodiments.

Filler cell region 202B is similar to cell region 202A of FIG. 2A. As with filler cell region 202A, filler cell region 202B similarly facilitates routability as compared to the filler cell region according to the other approach. Discussion of FIG. 2B will focus on differences of filler cell region 202B as compared to filler cell region 202A of FIG. 2A.

Filler cell region 202B includes CG shapes 218(5) and 218(6) instead of corresponding CG shapes 218(3) and 218(4) of filler cell region 202A of FIG. 2A. CG shape 218(5) overlies outer ends 234 of gate segments 212B(1) and 210(3). Gate segments 210(3) and 210(2) of filler cell region 202B correspond to gate segments 210(1) and 210(2) of filler cell region 202A. CG shape 218(5) overlies outer end 234 of gate segment 212B(2). Due to a gate-gap between CG shapes 218(5) and 218(6), no CG shape overlies outer end 234 of gate segment.

Due to corresponding CG-gap 244(1) between CG shapes 218(5) and 218(6), outer end 234 of gate segment 210(4) is not covered by a CG shape. As a result, outer end 234 of gate segment 210(4) aligns with bottom boundary 216B in an escape area 236(2). Relative to the Y-axis, outer end 234 of gate segment 210(4) extends farther away from central area 209 than outer ends 234 of gate segments 212B(1), 210(3) and 212B(2). In some embodiments (not shown), relative to the Y-axis, gate segment 210(4) extends beyond bottom boundary 216B into an adjacent cell region (not shown). In such embodiments, because outer end 234 of gate segment 210(4) aligns with bottom boundary 216B, outer end 234 of gate segment 210(4) is described as an escapable type of outer end 234.

Relative to the X-axis, escape area 230 aligns with escape area 236(2). Escape areas 230 and 236(2) are on the same side of midline 250 of filler cell region 202A. Accordingly, the locations of escape areas 230 and 236(2) represent an asymmetric aspect of filler cell region 202A with respect to midline 250. In some embodiments, midline 250 represents an axis of rotation, and filler cell region 202B is rotated 180 degrees about midline 250.

Figure 2C:
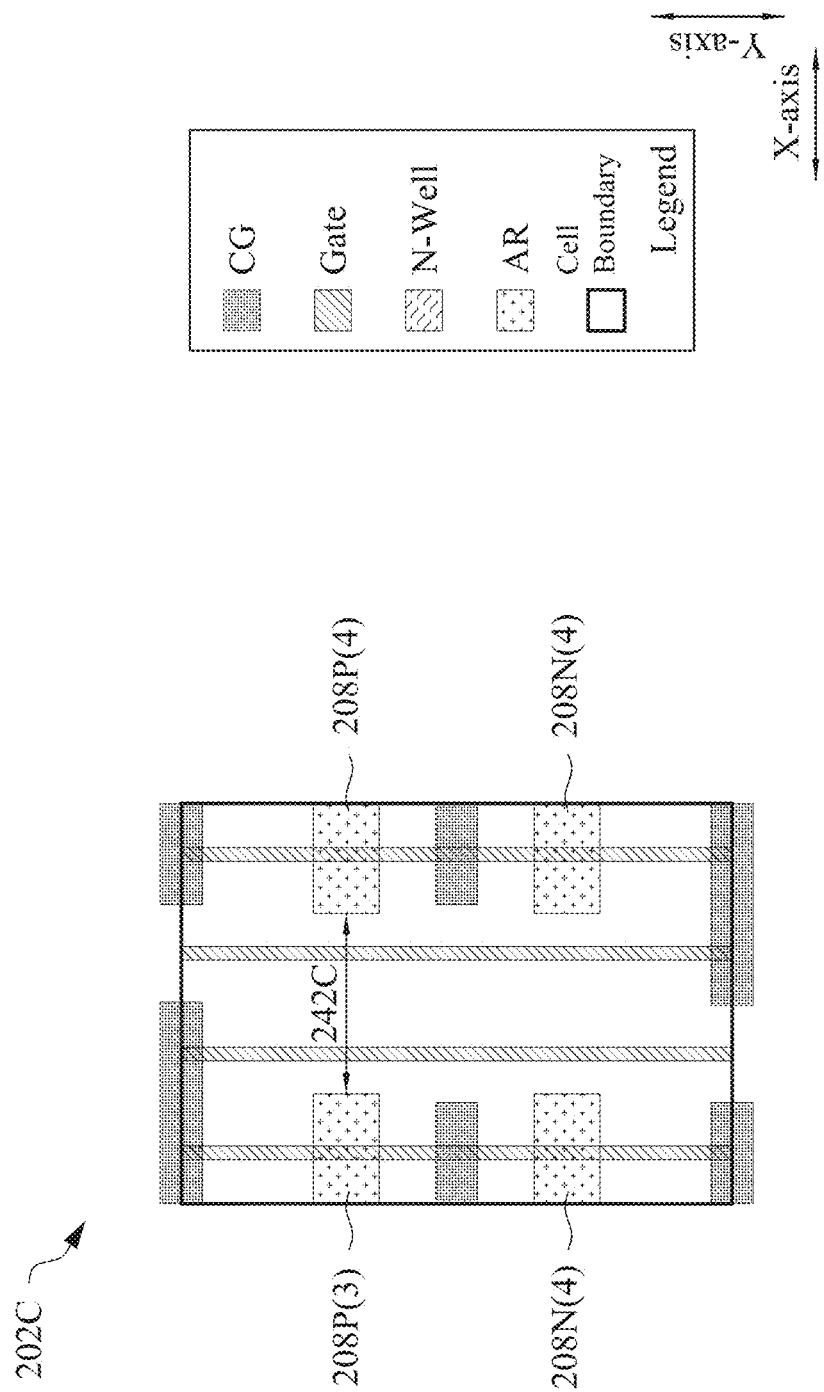

FIG. 2C is a layout diagram of a filler cell region 202C, in accordance with some embodiments.

Filler cell region 202C is similar to cell region 202A of FIG. 2A. As with filler cell region 202A, filler cell region 202C similarly facilitates routability as compared to the filler cell region according to the other approach. Discussion of FIG. 2C will focus on differences of filler cell region 202C as compared to filler cell region 202A of FIG. 2A.

Filler cell region 202C includes: collinear ARs 208P(3) and 208P(4) instead of corresponding collinear ARs 208P(1) and 208P(2) of filler cell region 202A of FIG. 2A; and collinear ARs 208N(3) and 20NP(4) instead of corresponding collinear ARs 208N(1) and 208N(2) of filler cell region 202A of FIG. 2A.

ARs 208P(3) and 208P(4) are separated by an AR-gap 242C. ARs 208N(3) and 208N(4) are separated by AR-gap 242C. In some embodiments, the size of AR-gap 242C is approximately an integer multiple of CPP. In FIG. 2C, the size of AR-gap 242C is approximately 2.0 CPP. In some embodiments, AR-gap 242C has a size other than approximately 2.0 CPP.

Figure 2D:
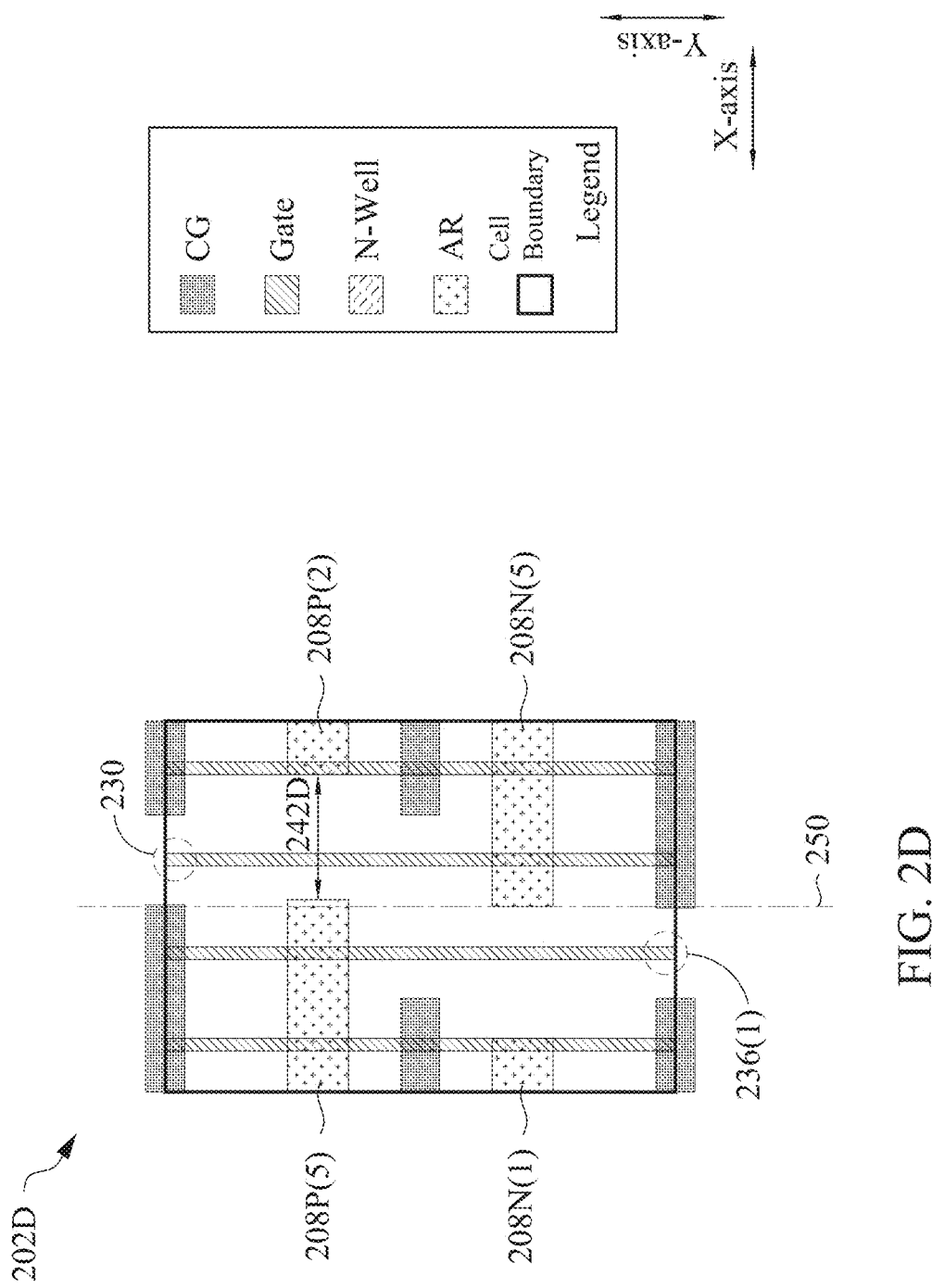

FIG. 2D is a layout diagram of a filler cell region 202D, in accordance with some embodiments.

Filler cell region 202D is similar to cell region 202A of FIG. 2A. As with filler cell region 202A, filler cell region 202D similarly facilitates routability as compared to the filler cell region according to the other approach. Discussion of FIG. 2D will focus on differences of filler cell region 202D as compared to filler cell region 202A of FIG. 2A.

Filler cell region 202D includes: AR 208P(5) instead of AR 208P(1) of filler cell region 202A of FIG. 2A; and AR 208N(5) instead of AR 208N(2) of filler cell region 202A of FIG. 2A.

ARs 208P(5) and 208P(2) are separated by an AR-gap 242D. ARs 208N(1) and 208N(5) are separated by AR-gap 242D. In some embodiments, the size of AR-gap 242D is approximately an integer multiple of CPP. In FIG. 2D, the size of AR-gap 242D is approximately 1.5 CPP. In some embodiments, AR-gap 242D has a size other than approximately 1.5 CPP.

Relative to the X-axis, the location of gap 242D between ARs 208P(5) and 208P(2) and the location of gap 242D between ARs 208N(1) and 208N(5) represent another asymmetric aspect of filler cell region 202D with respect to midline 250. In some embodiments, midline 250 represents an axis of rotation, and filler cell region 202D is rotated 180 degrees about midline 250.

Figure 2E:
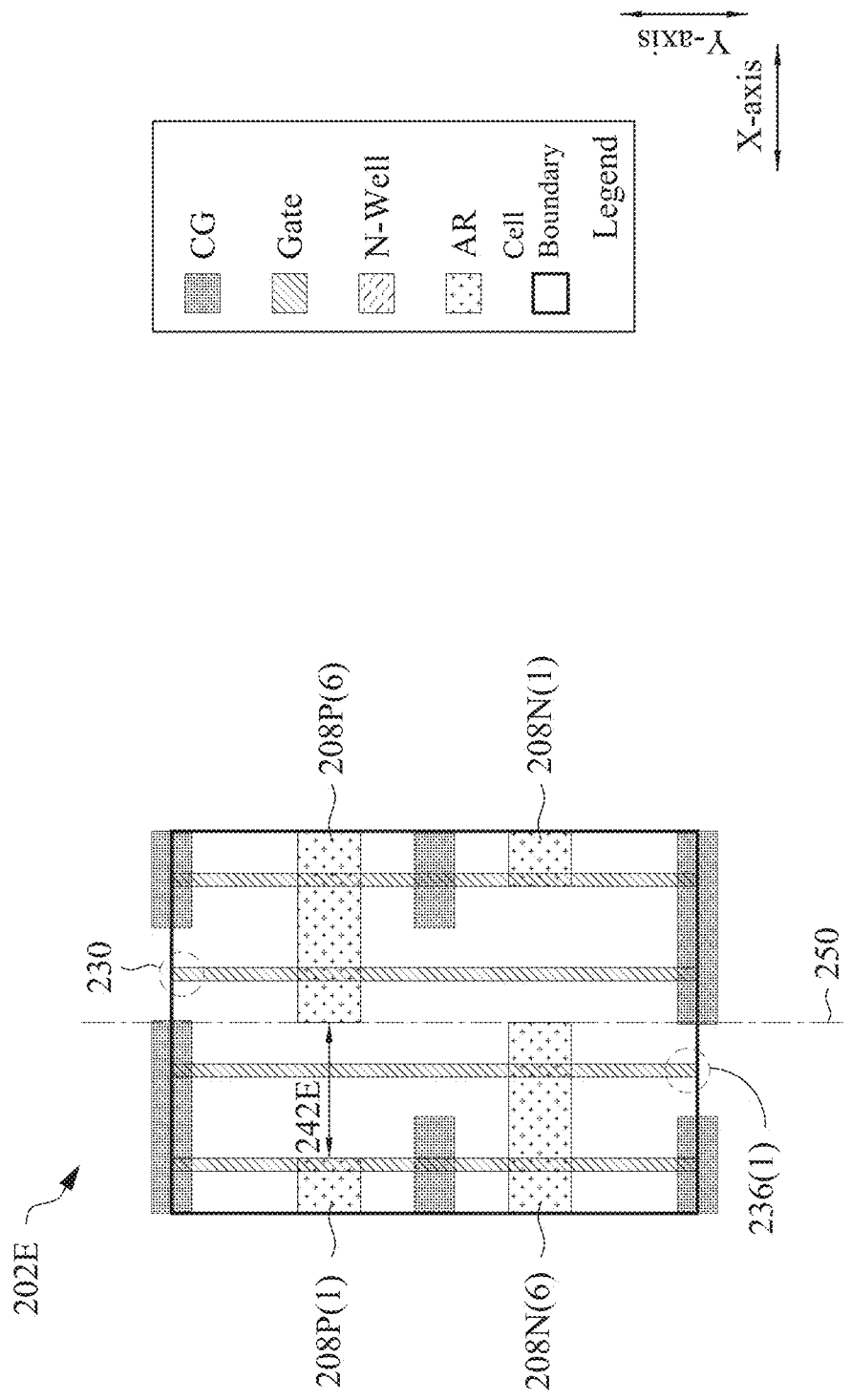

FIG. 2E is a layout diagram of a filler cell region 202E, in accordance with some embodiments.

Filler cell region 202E is similar to cell region 202D of FIG. 2D as well as cell region 202A of FIG. 2A. As with filler cell regions 202D and 202A, filler cell region 202E similarly facilitates routability as compared to the filler cell region according to the other approach. Discussion of FIG. 2E will focus on differences of filler cell region 202E as compared to filler cell region 202D of FIG. 2D and as compared to filler cell region 202A of FIG. 2A.

Filler cell region 202E includes: AR 208P(1) of filler cell region 202A instead of AR 208P(5); AR 208P(6) instead of AR 208P(1) of filler cell regions 202D and 202A; AR 208N(6) instead of AR 208N(1) of filler cell regions 202D and 202A; and AR 208N(1) of filler cell region 202A instead of AR 208N(5) of filler cell region 202D.

ARs 208P(1) and 208P(6) are separated by an AR-gap 242E. ARs 208N(6) and 208N(1) are separated by AR-gap 242D of FIG. 2D. In some embodiments, the size of AR-gap 242E is approximately an integer multiple of CPP. In FIG. 2E, the size of AR-gap 242E is approximately 1.5 CPP. In some embodiments, AR-gap 242E has a size other than approximately 1.5 CPP. In some embodiments, AR-gap 242E has the same size as AR-gap 242D of filler cell region 202D.

Relative to the X-axis, the location of gap 242E between ARs 208P(1) and 208P(6) and the location of gap 242E between ARs 208N(6) and 208N(1) represent another asymmetric aspect of filler cell region 202E with respect to midline 250. In some embodiments, midline 250 represents an axis of rotation, and filler cell region 202E is rotated 180 degrees about midline 250.

Figure 2F:
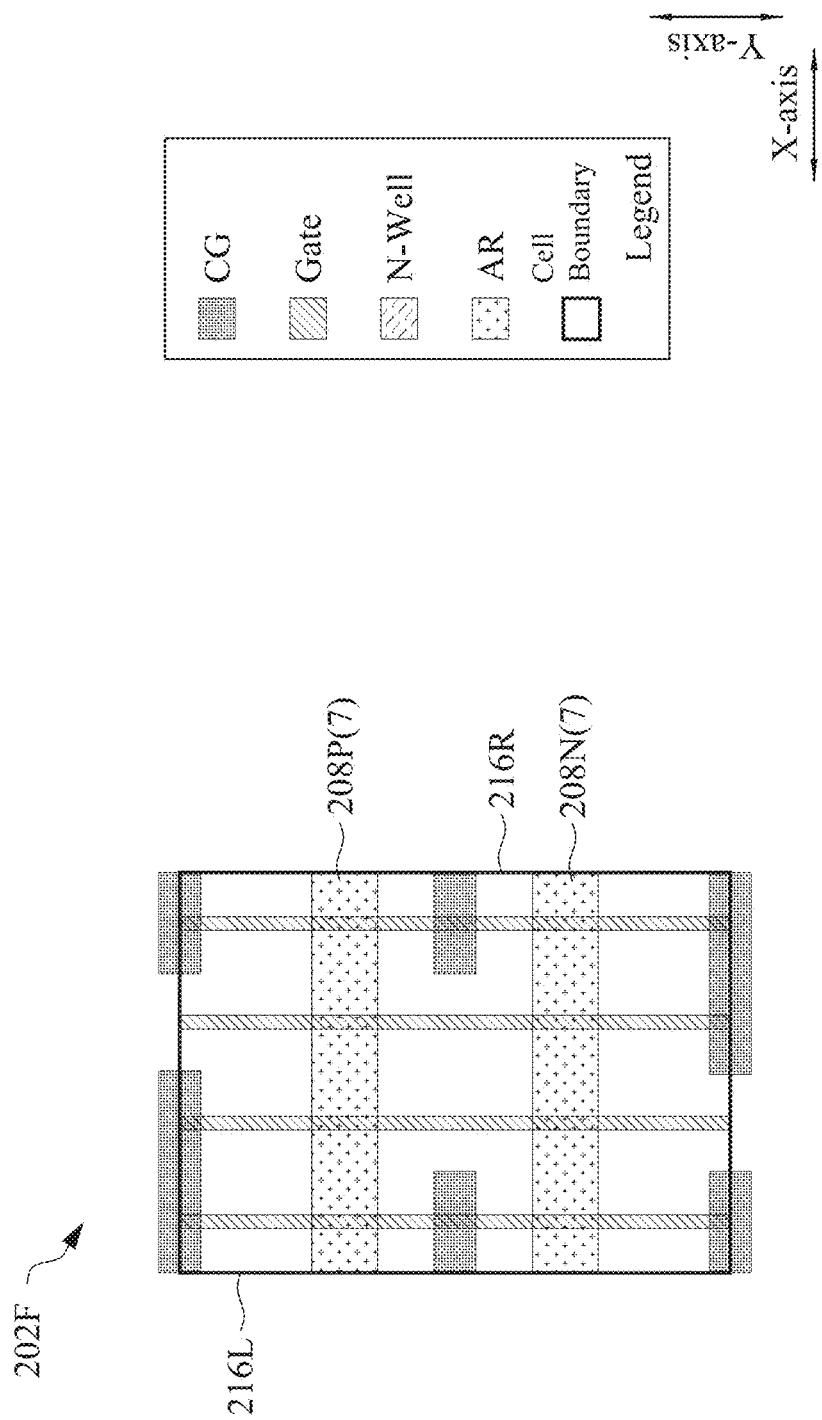

FIG. 2F is a layout diagram of a filler cell region 202F, in accordance with some embodiments.

Filler cell region 202F is similar to cell region 202C of FIG. 2C. As with filler cell region 202C, filler cell region 202F similarly facilitates routability as compared to the filler cell region according to the other approach. Discussion of FIG. 2F will focus on differences of filler cell region 202F as compared to filler cell region 202C of FIG. 2C.

Filler cell region 202F includes: AR 208P(7) instead of collinear ARs 208P(3) and 208P(4) of filler cell region 202C; and AR 208N(7) instead of collinear ARs 208N(3) and 208N(4) of filler cell region 202C. Relative to the X-axis, each of ARs 208P(7) and 208N(7) extend continuously across filler cell region 202F from left boundary 216L to right boundary 216R.

Figure 3A:
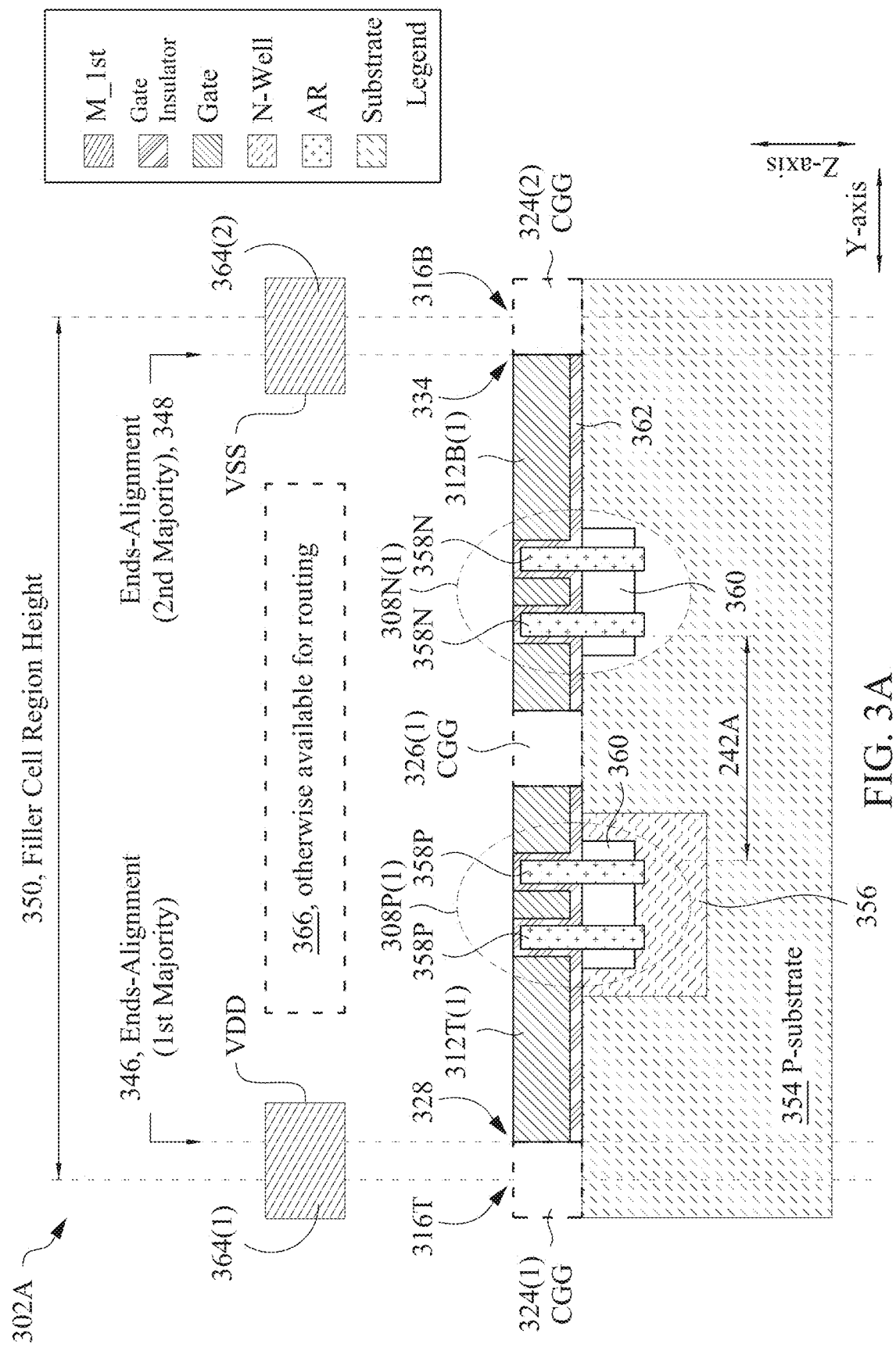
FIGS. 3A-3B are cross-sections, in accordance with some embodiments.
Figure 3B:
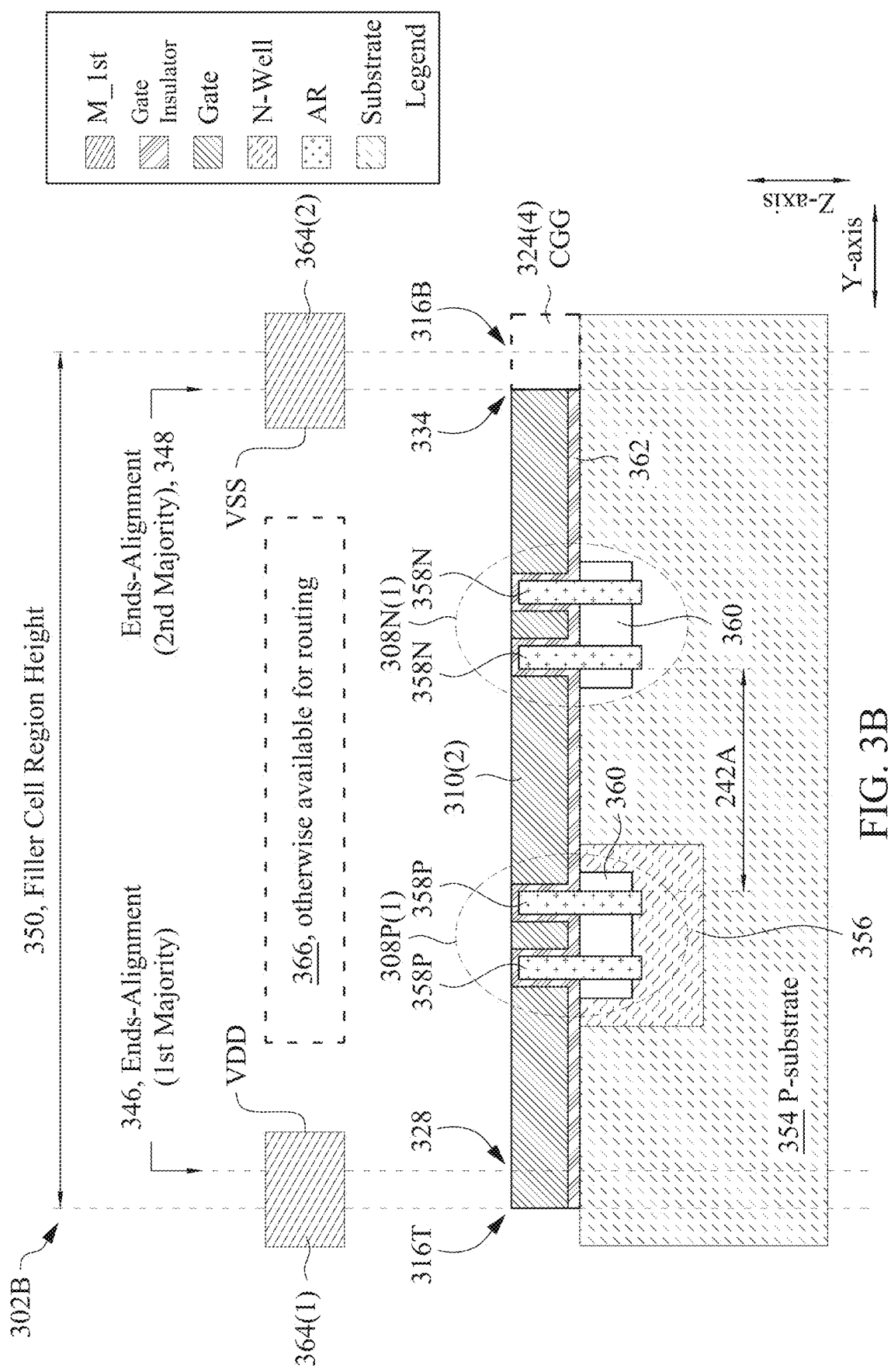

FIGS. 3A-3B are corresponding cross sectional views 302A-302B of a filler cell region that is included in a semiconductor device, in accordance with some embodiments.

In particular, FIGS. 3A-3B are cross sectional views of a filler cell region of a semiconductor device based on filler cell region 202A of FIG. 2A. FIGS. 3A-3B assume a context of complementary metal oxide semiconductor (CMOS) technology for which PMOS AR is in an N-well. FIGS. 3A-3B correspond to section lines 3A-3A' and 3B-3B' of FIG. 2A. For simplicity of illustration, FIGS. 3A-3B further assume a fin-FET architecture in which each AR is represented by two fins, i.e., AR 208P(1) is represented by X instances of P-type fin 358P and AR 208N(1) is represented by X instances of N-type fin 358N, where X=2. In other embodiments, X is a positive integer other than 2. In some embodiments, AR 208P(1) has a different number of fins 358P as compared to the number of fins 358N of AR 208N(1).

Each of FIGS. 3A-3B includes: a P-type substrate 354; an N-well 356 in substrate 354; P-type fins 358P partially in N-well 356 relative to the Z-axis; N-type fins 358N partially in substrate 354 relative to the Z-axis; a first gate insulator 360 against fins 358P in N-well 356; and a second gate insulator 362 on fins 358P and 358N, first gate insulator 360, N-well 356 and P-substrate 354.

In each of FIGS. 3A-3B, the filler cell region has a height 350 and further includes gate segments 312T(1) and 312B(1) on second gate insulator 362; and M_1st conductive segments 364(1) and 364(2) in the M_1st layer. M_1st segments 364(1) and 364(2) corresponds to the first and second M_1st segments discussed in the context of FIG. 2A. Relative to the Y-axis, an area 366 between M_1st segments 364(1) and 364(2) is otherwise available for routing.

In some embodiments, the P-type substrate includes silicon, silicon germanium (SiGe), gallium arsenic, or other suitable semiconductor materials. The fins are formed in or over the P-type substrate, using one or more masks corresponding to one or more active regions in the layout diagrams described herein. The second gate insulating layer is deposited over the P-type substrate, among others. Example materials that comprise the second gate insulating layer include, but are not limited to, a high-k dielectric layer, an interfacial layer, and/or combinations thereof. In some embodiments, the second gate dielectric material layer is deposited over the P-type substrate by atomic layer deposition (ALD) or other suitable techniques. Example materials that comprise the gate lines include, but are not limited to, polysilicon, metal, Al, AlTi, Ti, TiN, TaN, Ta, TaC, TaSiN, W, WN, MoN, and/or other suitable conductive materials.

In FIG. 3A, areas 324(1), 326(1) and 324(2) are not occupied by gate segment 312T(1) nor 312B(1) due to the effects of corresponding CG shapes 218(1), 222(1) and 218(3) of FIG. 2A. In some embodiments, areas 324(1), 326(1) and 324(2) are described as ghosts of CG shapes 218(1), 222(1) and 218(3). In some embodiments, areas 324(1), 326(1) and 324(2) are referred to as CG ghosts (CGGs) 324(1), 326(1) and 324(2). Relative to the Y-axis: outer end 328 of gate segment 312T(1) aligns with reference line 346 rather than top border 316T; and outer end 334 of gate segment 312B(1) aligns with reference line 348 rather than bottom border 316B.

In FIG. 3B, area 324(4) is not occupied by gate segment 310(2) due to the effects of corresponding CG shape 218(4) of FIG. 2A. In some embodiments, area 324(4) is referred to as CGGs 324(4). Relative to the Y-axis, outer end 334 of gate segment 310(2) aligns with reference line 348. Due to the absence of a CG pattern over outer end 228 of gate segment 210(2) in FIG. 2A, outer end 328 of gate segment 310(2) in FIG. 3B aligns with top border 316T of the filler cell region.

Figure 4A:
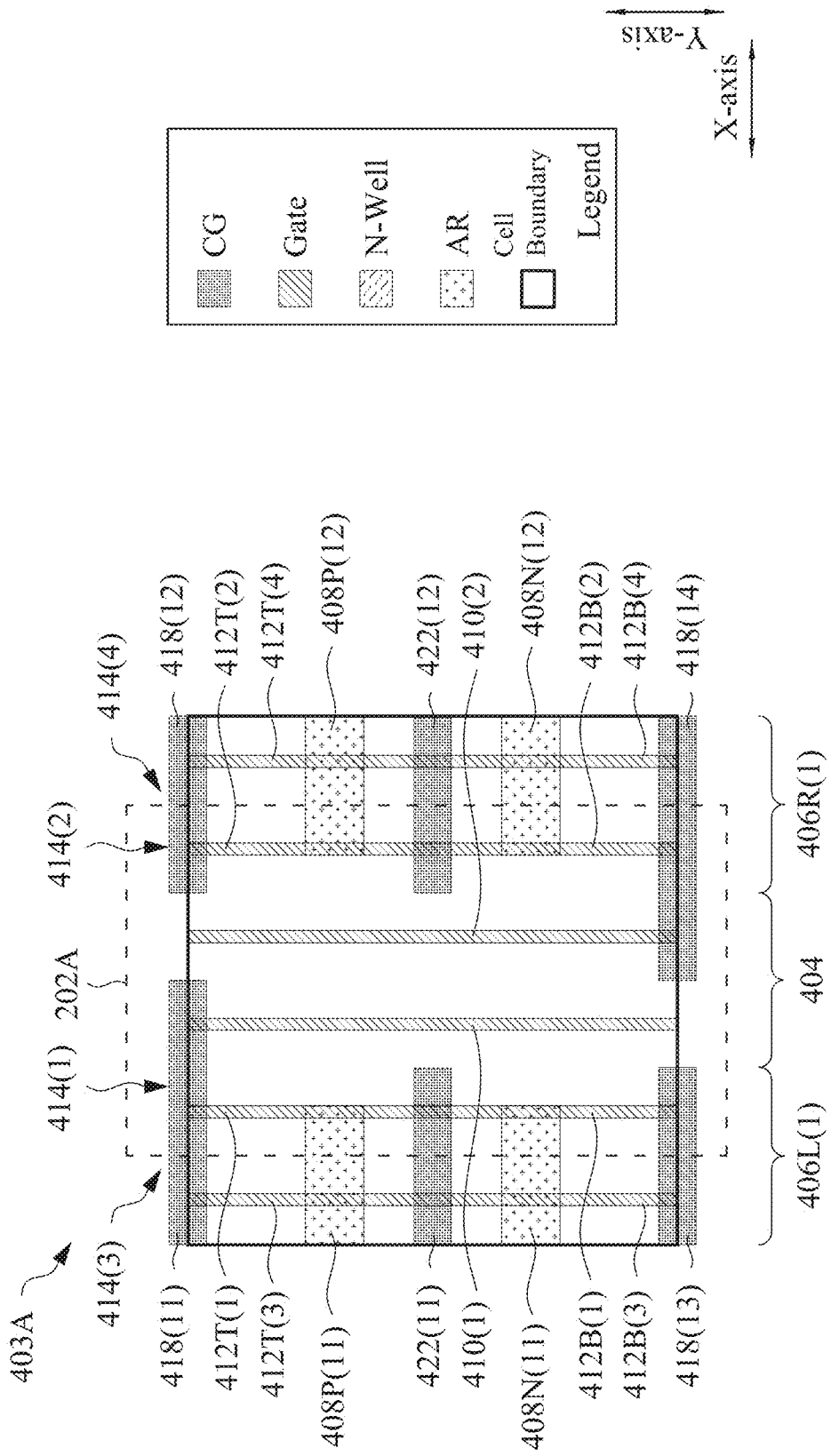
FIGS. 4A-4E are layout diagrams, in accordance with some embodiments.

FIG. 4A is a layout diagram of a filler cell region 403A, in accordance with some embodiments.

Filler cell region 403A is similar to cell region 202A of FIG. 2A. As with filler cell region 202A, filler cell region 403A similarly facilitates routability as compared to the filler cell region according to the other approach. Discussion of FIG. 4A will focus on differences of filler cell region 403A as compared to filler cell region 202A of FIG. 2A.

Filler cell region 403A includes:
centrally-uncut region 404;
centrally-cut regions 406L(1) and 406R(1);
ARs 408P(11)-408P(12) and 408N(11)-408N(12);
gate segments 410(1)-410(2); 412T(1)-412T(2) and 412B(1)-412B(2);
dyads 414(1)-414(2);
CG shapes 418(11)-418(14) and 422(11)-422(12).

As compared to filler cell region 202A, filler cell region 403A is expanded in size relative to the X-axis. In effect, filler cell region 403A includes filler cell region 202A plus a pair of additional dyads 414(3) and 414(4). As a result, centrally-cut gate regions 406L(1) and 406R(1) are wider (relative to the X-axis) than corresponding centrally-cut gate regions 206L and 206R of filler cell region 202A. Dyad 413(3) includes collinear gate segments 412T(3) and 412B(3). Dyad 413(4) includes collinear gate segments 412T(4) and 412B(4).

In general, filler cell region 202A of FIG. 2A is progressively expanded in size relative to the X-axis by adding progressively adding pairs of dyads to left 216L and right 216R boundaries of cell regions 202A.

Figure 4B:
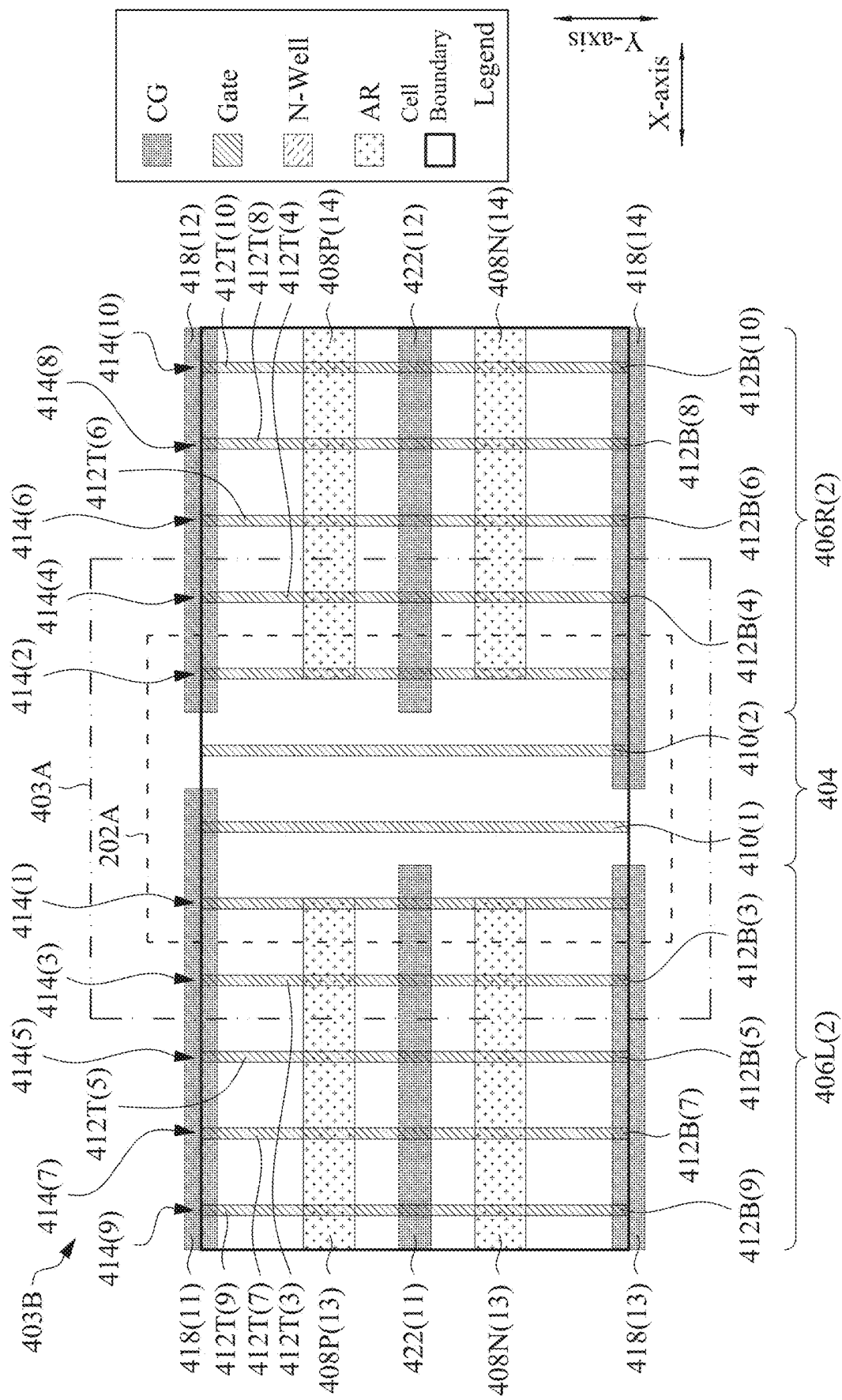

FIG. 4B is a layout diagram of a filler cell region 403B(1), in accordance with some embodiments.

Filler cell region 403B(1) is similar to filler cell region 403A of FIG. 4A. As with filler cell region 403A, filler cell region 403B(1) similarly facilitates routability as compared to the filler cell region according to the other approach. Discussion of FIG. 4B will focus on differences of filler cell region 403B(1) as compared to filler cell region 403A of FIG. 4A.

As compared to filler cell region 403A, filler cell region 403B(1) is expanded in size relative to the X-axis. In effect, filler cell region 403B(1) includes filler cell region 403A plus three pairs of additional dyads, namely a pair of dyads 414(5) and 414(6), a pair of dyads 414(7) and 414(8), and a pair of dyads 414(9) and 414(1). As a result, centrally-cut gate regions 406L(2) and 406R(2) are wider (relative to the X-axis) than corresponding centrally-cut gate regions 406L(1) and 406R(1) of filler cell region 403A.

Dyad 413(5) includes collinear gate segments 412T(5) and 412B(5). Dyad 413(6) includes collinear gate segments 412T(6) and 412B(6). Dyad 413(7) includes collinear gate segments 412T(7) and 412B(7). Dyad 413(8) includes collinear gate segments 412T(8) and 412B(8). Dyad 413(9) includes collinear gate segments 412T(9) and 412B(9). Dyad 413(10) includes collinear gate segments 412T(10) and 412B(10).

Figure 4C:
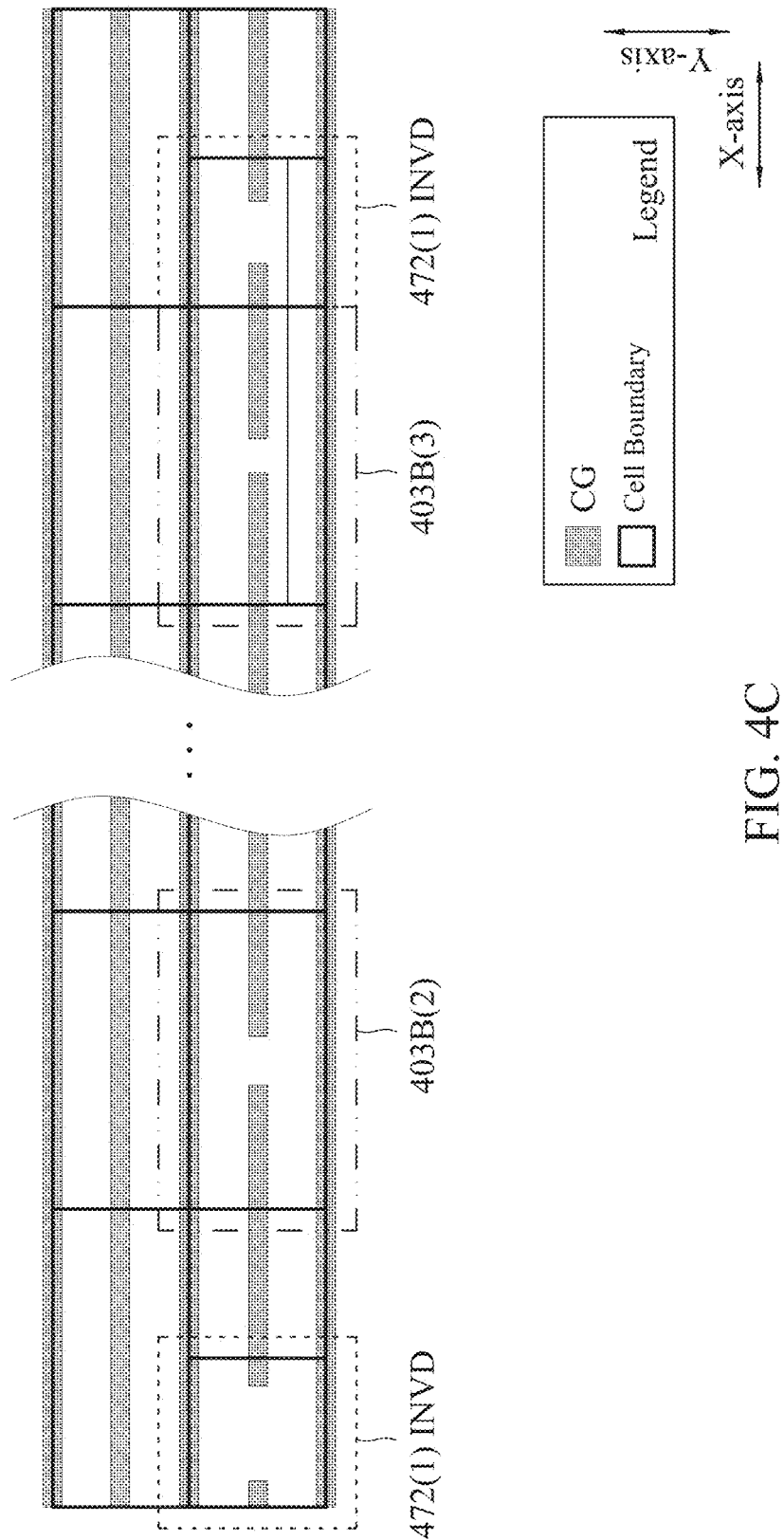

FIG. 4C is a layout diagram of a semiconductor device 470C, in accordance with some embodiments.

FIG. 4C provides an example of using filler cell region 403B(1) of FIG. 4B in the context of a larger semiconductor device, namely 470C. Semiconductor device 470C includes filler cell regions 403B(2) and 403B(3) and inverter cell regions 472(1) and 472(2). Filler cell regions 403B(2) and 403B(3) represent instances of filler cell region 403B(1).

Figure 4D:
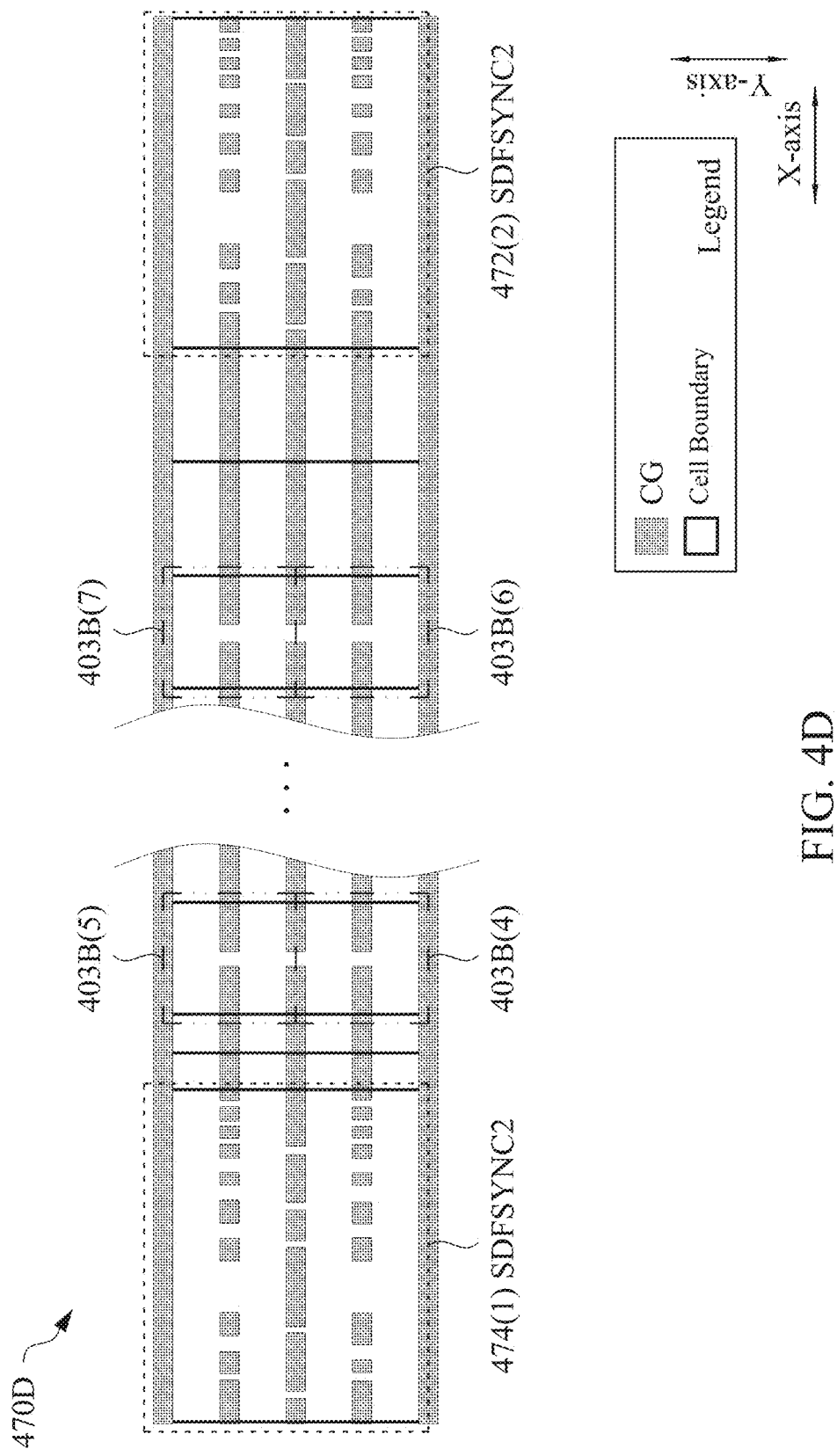

FIG. 4D is a layout diagram of a semiconductor device 470D, in accordance with some embodiments.

FIG. 4D provides an example of using filler cell region 403B(1) of FIG. 4B in the context of a larger semiconductor device, namely 470D. Semiconductor device 470D includes filler cell regions 403B(4), 403B(5), 403B(6) and 403B(7) and scan D flip-flop synchronizer (SDFSYNC) cell regions 474(1) and 474(2). Filler cell regions 403B(4), 403B(5), 403B(6) and 403B(7) represent instances of filler cell region 403B(1). Relative to the Y-axis: filler cell regions 403B(4) and 403B(5) are stacked on each other; and filler cell regions 403B(6) and 403B(7) are stacked on each other.

Figure 4E:
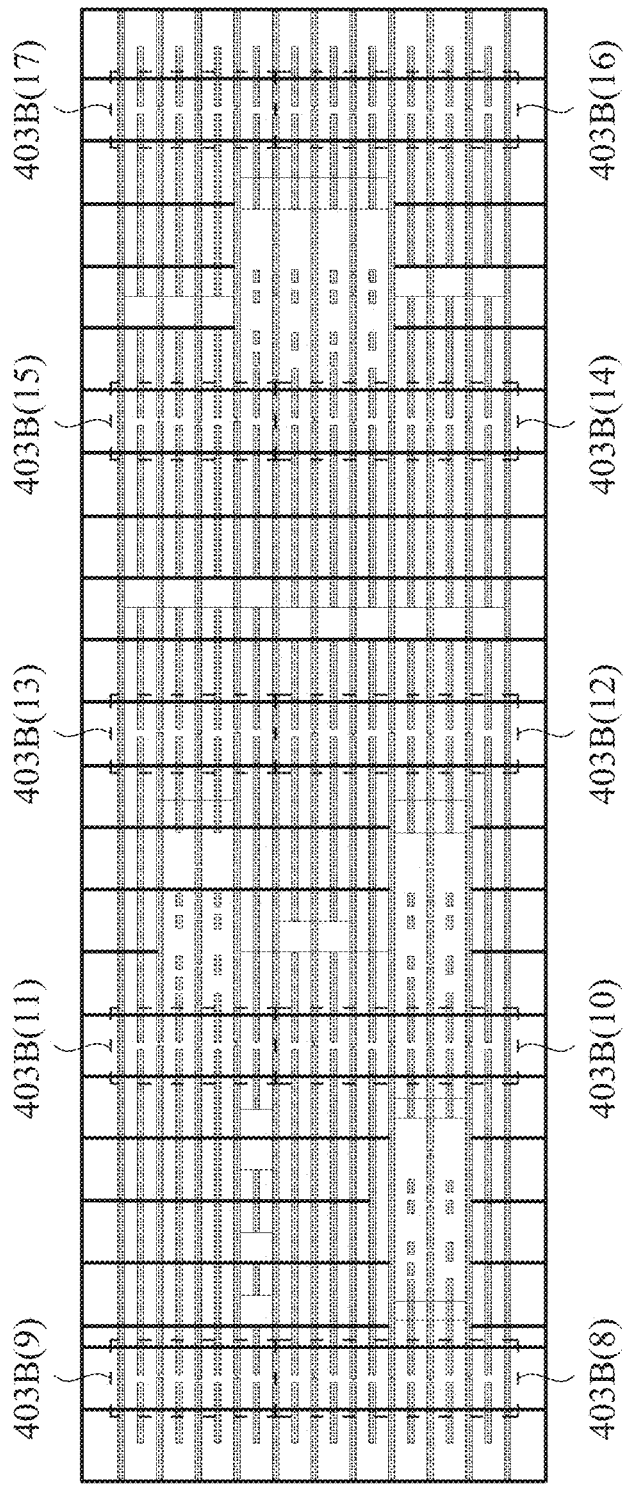

FIG. 4E is a layout diagram of a semiconductor device 470E, in accordance with some embodiments.

FIG. 4E provides an example of using filler cell region 403B(1) of FIG. 4B in the context of a larger semiconductor device, namely 470E. Semiconductor device 470E includes filler cell regions 403B(8)-403B(17), each of which is an instance of filler cell region 403B(1) of FIG. 4B. In some embodiments, each of filler cell regions 403B(8)-403B(17) is an instance of filler cell filler cell region 403A of FIG. 4A. In some embodiments, each of filler cell regions 403B(8)-403B(17) is an instance of filler cell filler cell region 202A of FIG. 2A, 202B of FIG. 2B, 202C of FIG. 2C, 202D of FIG. 2D, 202E of FIG. 2E, or the like. In some embodiments, filler cell regions 403B(8)-403B(17) are not all the same but instead correspond to various combinations of the filler cell regions disclosed herein, or the like.

Relative to the Y-axis: filler cell regions 403B(8) and 403B(9) are stacked on each other; filler cell regions 403B(10) and 403B(11) are stacked on each other; filler cell regions 403B(12) and 403B(13) are stacked on each other; filler cell regions 403B(14) and 403B(15) are stacked on each other; and filler cell regions 403B(16) and 403B(17) are stacked on each other.

FIG. 5A is a flow diagram 500A of a method of manufacturing a semiconductor device, in accordance with some embodiments.

The method of flowchart 500A is implementable, for example, using EDA system 600 (FIG. 6, discussed below) and an IC manufacturing system 700 (FIG. 7, discussed below), in accordance with some embodiments. Examples of a semiconductor device which can be manufactured according to the method of flowchart 500A include the semiconductor device of FIG. 1, semiconductor devices based on the layout diagrams disclosed herein, or the like.

In FIG. 5A, the method of flowchart 500A includes blocks 502-504. At block 502, a layout diagram is generated which, among other things, includes one or more of layout diagrams disclosed herein, or the like. Block 502 is implementable, for example, using EDA system 600 (FIG. 6, discussed below), in accordance with some embodiments. From block 502, flow proceeds to block 504.

At block 504, based on the layout diagram, at least one of (A) one or more photolithographic exposures are made or (B) one or more semiconductor masks are fabricated or (C) one or more components in a layer of a semiconductor device are fabricated. See discussion below of IC manufacturing system 700 in FIG. 7 below.

FIG. 5B is a method 500B of fabricating a semiconductor device, in accordance with some embodiments.

The method of flowchart 500B is implementable, for example, using IC manufacturing system 700 (FIG. 7, discussed below), in accordance with some embodiments. Examples of a semiconductor device which can be manufactured according to the method of flowchart 500B include the semiconductor device of FIG. 1, semiconductor devices based on the layout diagrams disclosed herein, or the like.

Method 500B includes blocks 512-516. At block 512, active regions (ARs) of a filler cell are formed in a substrate. In some embodiments, forming ARs includes doping corresponding areas of the substrate. Relative to a first direction (e.g., parallel to the X-axis), the forming ARs results in first & second and third & fourth ones of the ARs being correspondingly coaxial and separated by corresponding first and second AR-gaps located centrally in the filler cell region. An example of the substrate is substrate 354 of FIGS. 3A-3B. An example of the filler cell region is filler cell region 202A of FIG. 2A, or the like. Examples of the active regions include coaxial ARs 208P(1)-208P(2) and coaxial 208N(1)-208N(2) of FIG. 2A, or the like. Examples of the AR-gaps include AR-gaps 242A in FIG. 2A, or the like. From block 512, flow proceeds to block 514.

At block 514, gate segments of the filler cell region are formed over corresponding ones of the ARs. Examples of the gate segments include gate segments 210(1)-210(2), 212T(1)-212T(2) and 212B(1)-212B(2) of FIG. 2A, or the like. The forming gate segments result in the gate segments being free from electrical coupling to active or passive circuitry within the filler cell region. From block 515, flow proceeds to block 516.

Regarding block 514, relative to a second direction (e.g., parallel to the Y-axis), the forming gate segments result in: a majority of first ends of the gate segments substantially aligning with a first reference line extending in the first direction, the first reference line being parallel and proximal to a top boundary of the filler cell region; and a majority of second ends of the gate segments substantially aligning with a second reference line extending in the first direction (X-axis) and being parallel and proximal to a bottom boundary of the filler cell region. An example of the first reference line is reference line 246 of FIG. 2A, or the like. An example of the first majority of first ends of the gate segments substantially aligning with the first reference line are outer ends 228 of gate segments 212T(1), 210(1) 212T(2) of FIG. 2A, or the like. An example of the second reference line is reference line 248 of FIG. 2A, or the like. An example of the second majority of second ends of the gate segments substantially aligning with the second reference line are outer ends 234 of gate segments 212B(1), 210(2) 212B(2) of FIG. 2A, or the like.

Regarding block 514, relative to a second direction (e.g., parallel to the Y-axis), the forming gate segments further results in: first and second ones of the gate segments extending continuously across the filler cell region; and third & fourth and fifth & sixth ones of the gate segments being correspondingly coaxial and separated by corresponding gate-gaps located centrally in the filler cell region. Examples of first and second ones of the gate segments extending continuously across the filler cell region include gate segments 210(1) and 210(2) of FIG. 2A, or the like. Examples of the third & fourth and fifth & sixth ones of the gate segments being correspondingly coaxial and separated by corresponding gate-gaps located centrally in the filler cell region include dyads 214(1) and 214(2), or the like, where dyad 214(1) includes coaxial gate segments 212T(1) and 212B(1), and dyad 214(2) includes coaxial gate segments 212T(2) and 212B(2).

Regarding block 514, relative to the first direction (e.g., parallel to the X-axis), the forming gate segments further results in the first and second gate segments being between the third & fourth gate segments and the fifth & sixth gate segments. Examples of the first and second gate segments being between the third & fourth gate segments and the fifth & sixth gate segments includes gate segments 210(1) and 210(2) being between dyads 214(1) and 214(2), or the like, where (again) dyad 214(1) includes coaxial gate segments 212T(1) and 212B(1), and (again) dyad 214(2) includes coaxial gate segments 212T(2) and 212B(2).

Regarding block 514, relative to the second direction (Y-axis), the forming gate segments further results in: a first end the first gate segment extending to the top boundary; and a second end the second gate segment extending to the bottom boundary. An example of the first end the first gate segment extending to the top boundary is outer end 228 of gate segment 210(2) aligning with top boundary 216T in an escape area 230 of FIG. 2A, or the like. An example of the second end of the second gate segment extending to the bottom boundary is outer end 234 of gate segment 210(1) aligning with bottom boundary 216B in an escape area 236(1) of FIG. 2A, or the like.

At block 516, metallization segments are formed/routed through the filler cell region. It is to be recalled that gate segments in the filler cell region, e.g., 210(1)-210(2), 212T(1)-212T(2) and 212B(1)-212B(2) of FIG. 2A, or the like, are free from electrical coupling to active or passive circuitry within the filler cell region. If the filler cell region was otherwise occupied by an active circuit region or a passive circuitry region, then the routing-space over the filler cell region otherwise would be consumed in part or in whole by metallization segments electrically coupled to one or more of the gate segments in the active circuit region or a passive circuitry region. Because the gate segments of the filler cell region are free from electrical coupling to active or passive circuitry within the filler cell region, routing-space over the filler cell region is not consumed by metallization segments which electrically couple to the gate segments of the filler cell region, which makes the routing space over the filler cell region available for routing associated with other cell regions.

Figure 6:
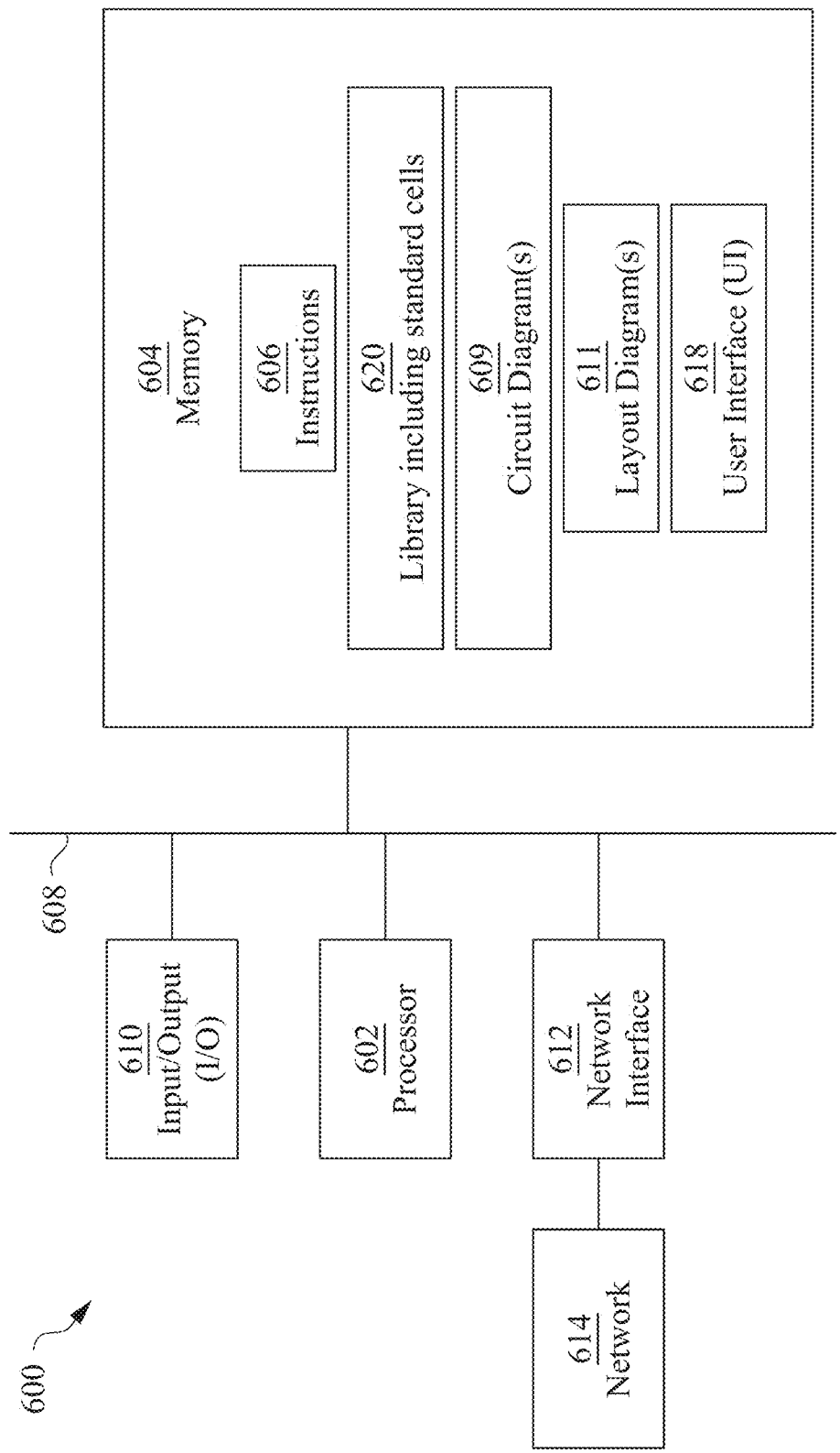
FIG. 6 is a block diagram of an electronic design automation (EDA) system in accordance with some embodiments.

FIG. 6 is a block diagram of an electronic design automation (EDA) system 600 in accordance with some embodiments.

In some embodiments, EDA system 600 includes an APR system. In some embodiments, EDA system 600 is a general purpose computing device including a hardware processor 602 and a non-transitory, computer-readable storage medium 604. Storage medium 604, amongst other things, is encoded with, i.e., stores, computer program code 606, i.e., a set of executable instructions. Execution of instructions 606 by hardware processor 602 represents (at least in part) an EDA tool which implements a portion or all of, e.g., the methods of FIGS. 5A-5B, in accordance with one or more embodiments (hereinafter, the noted processes and/or methods). Storage medium 604, amongst other things, stores layout diagram disclosed herein, other the like.

Processor 602 is electrically coupled to computer-readable storage medium 604 via a bus 608. Processor 602 is further electrically coupled to an I/O interface 610 by bus 608. A network interface 612 is further electrically connected to processor 602 via bus 608. Network interface 612 is connected to a network 614, so that processor 602 and computer-readable storage medium 604 are capable of connecting to external elements via network 614. Processor 602 is configured to execute computer program code 606 encoded in computer-readable storage medium 604 in order to cause system 600 to be usable for performing a portion or all of the noted processes and/or methods. In one or more embodiments, processor 602 is a central processing unit (CPU), a multi-processor, a distributed processing system, an application specific integrated circuit (ASIC), and/or a suitable processing unit.

In one or more embodiments, computer-readable storage medium 604 is an electronic, magnetic, optical, electromagnetic, infrared, and/or a semiconductor system (or apparatus or device). For example, computer-readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 604 includes a compact disk-read only memory (CD-ROM), a compact disk-read/write (CD-R/W), and/or a digital video disc (DVD).

In one or more embodiments, storage medium 604 stores computer program code 606 configured to cause system 600 (where such execution represents (at least in part) the EDA tool) to be usable for performing a portion or all of the noted processes and/or methods. In one or more embodiments, storage medium 604 further stores information which facilitates performing a portion or all of the noted processes and/or methods. In one or more embodiments, storage medium 604 stores library 620 of standard cells including such standard cells as disclosed herein, one or more circuit diagrams 609 and one or more layout diagrams 611.

EDA system 600 includes I/O interface 610. I/O interface 610 is coupled to external circuitry. In one or more embodiments, I/O interface 610 includes a keyboard, keypad, mouse, trackball, trackpad, touchscreen, and/or cursor direction keys for communicating information and commands to processor 602.

EDA system 600 further includes network interface 612 coupled to processor 602. Network interface 612 allows system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 600.

System 600 is configured to receive information through I/O interface 610. The information received through I/O interface 610 includes one or more of instructions, data, design rules, libraries of standard cells, and/or other parameters for processing by processor 602. The information is transferred to processor 602 via bus 608. EDA system 600 is configured to receive information related to a UI through I/O interface 610. The information is stored in computer-readable medium 604 as user interface (UI) 618.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 600. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 7:
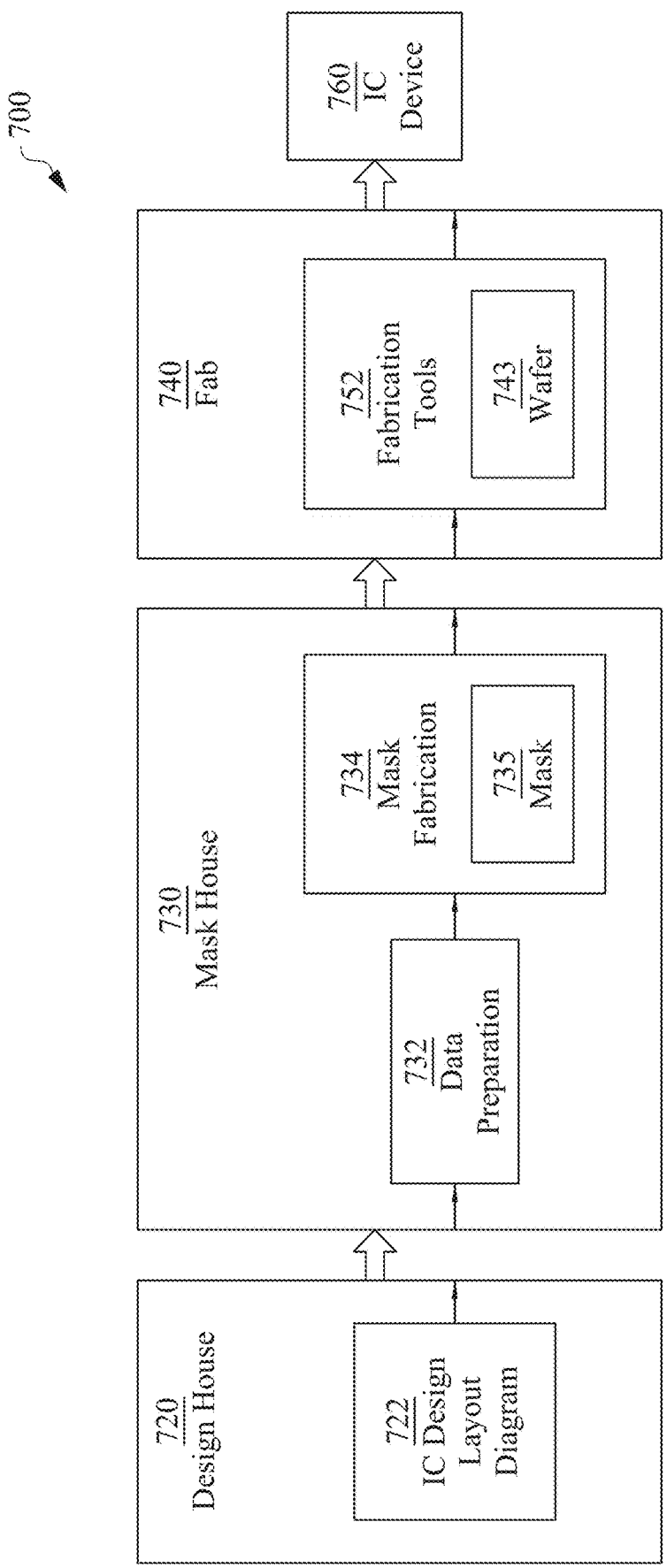
FIG. 7 is a block diagram of an integrated circuit (IC) manufacturing system, and an IC manufacturing flow associated therewith, in accordance with some embodiments.

FIG. 7 is a block diagram of an integrated circuit (IC) manufacturing system 700, and an IC manufacturing flow associated therewith, in accordance with some embodiments.

Based on the layout diagram generated by block 502 of FIG. 5A, the IC manufacturing system 700 implements block 504 of FIG. 5A wherein at least one of (A) one or more semiconductor masks or (B) at least one component in a layer of an inchoate semiconductor integrated circuit is fabricated using manufacturing system 700. In some embodiments, blocks 510-514 of FIG. 5B are implemented by the IC manufacturing system 700 in order to perform block 504 of FIG. 5A.

In FIG. 7, IC manufacturing system 700 includes entities, such as a design house 720, a mask house 730, and an IC manufacturer/fabricator ("fab") 740, that interact with one another in the design, development, and manufacturing cycles and/or services related to manufacturing an IC device 760. The entities in system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 720, mask house 730, and IC fab 740 is owned by a single larger company. In some embodiments, two or more of design house 720, mask house 730, and IC fab 740 coexist in a common facility and use common resources.

Design house (or design team) 720 generates an IC design layout 722. IC design layout 722 includes various geometrical patterns designed for an IC device 760. The geometrical patterns correspond to patterns of metal, oxide, or semiconductor layers that make up the various components of IC device 760 to be fabricated. The various layers combine to form various IC features. For example, a portion of IC design layout 722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 720 implements a proper design procedure to form IC design layout 722. The design procedure includes one or more of logic design, physical design or place and route. IC design layout 722 is presented in one or more data files having information of the geometrical patterns. For example, IC design layout 722 is expressed in a GDSII file format or DFII file format.

Mask house 730 includes data preparation 732 and mask fabrication 734. Mask house 730 uses IC design layout 722 to manufacture one or more masks to be used for fabricating the various layers of IC device 760 according to IC design layout 722. Mask house 730 performs mask data preparation 732, where IC design layout 722 is translated into a representative data file ("RDF"). Mask data preparation 732 supplies the RDF to mask fabrication 734. Mask fabrication 734 includes a mask writer. A mask writer converts the RDF to an image on a substrate, such as a mask (reticle) or a semiconductor wafer. The design layout is manipulated by mask data preparation 732 to comply with particular characteristics of the mask writer and/or requirements of IC fab 740. In FIG. 7, mask data preparation 732, mask fabrication 734, and mask 735 are illustrated as separate elements. In some embodiments, mask data preparation 732 and mask fabrication 734 are collectively referred to as mask data preparation.

In some embodiments, mask data preparation 732 includes optical proximity correction (OPC) which uses lithography enhancement techniques to compensate for image errors, such as those that can arise from diffraction, interference, other process effects and the like. OPC adjusts IC design layout 722. In some embodiments, mask data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 732 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 734, which may undo part of the modifications performed by OPC in order to meet mask creation rules.

In some embodiments, mask data preparation 732 includes lithography process checking (LPC) that simulates processing that will be implemented by IC fab 740 to fabricate IC device 760. LPC simulates this processing based on IC design layout 722 to fabricate a simulated manufactured device, such as IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 722.

The above description of mask data preparation 732 has been simplified for the purposes of clarity. In some embodiments, data preparation 732 includes additional features such as a logic operation (LOP) to modify the IC design layout according to manufacturing rules. Additionally, the processes applied to IC design layout 722 during data preparation 732 may be executed in a variety of different orders.

After mask data preparation 732 and during mask fabrication 734, a mask 735 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 734 is used in a variety of processes. For example, such a mask(s) is used in an ion implantation process to form various doped regions in the semiconductor wafer, in an etching process to form various etching regions in the semiconductor wafer, and/or in other suitable processes.

IC fab 740 is an IC fabrication business that includes one or more manufacturing facilities for the fabrication of a variety of different IC products. In some embodiments, IC fab 740 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 740 uses the mask (or masks) fabricated by mask house 730 to fabricate IC device 760 using fabrication tools 742. Thus, IC fab 740 at least indirectly uses IC design layout 722 to fabricate IC device 760. In some embodiments, a semiconductor wafer 743 is fabricated by IC fab 740 using the mask (or masks) to form IC device 760. Semiconductor wafer 743 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, a semiconductor device includes a filler cell region including gate segments extending in a first direction and being free from electrical coupling to active or passive circuitry within the filler cell region. Relative to the first direction: a majority of first ends of the gate segments substantially aligns with a first reference line extending in a second direction perpendicular to the first direction, the first reference line being parallel and proximal to a top boundary of the filler cell region; a majority of second ends of the gate segments substantially aligns with a second reference line extending in the second direction and being parallel and proximal to a bottom boundary of the filler cell region; first and second ones of the gate segments extending continuously across the filler cell region; and third & fourth and fifth & sixth ones of the gate segments being correspondingly coaxial and separated by corresponding gate-gaps located centrally in the filler cell region. Relative to the second direction, the first and second gate segments being between the third & fourth gate segments and the fifth & sixth gate segments. Also relative to the first direction: a first end of the first gate segment extending to the top boundary; and a second end of the second gate segment extending to the bottom boundary.

In some embodiments, the first and second gate segments are the same. In some embodiments, relative to the second direction, a seventh one of the gate segments is between the third & fourth gate segments and the fifth & sixth gate segments, and, relative to the first direction: a first end of the seventh gate segment substantially aligns with the first reference line; and a second end of the seventh gate segment substantially aligns with the second reference line. In some embodiments, relative to the first direction: a second end of the first gate segment substantially aligns with the second reference line; and a first end of the second gate segment substantially aligns with the first reference line.

In some embodiments, the filler cell region further includes active regions (ARs) extending in the second direction; relative to the second direction, first & second and third & fourth ones of the ARs being correspondingly coaxial and separated by corresponding first and second AR-gaps located centrally in the filler cell region; and wherein relative to the second direction: a distance between two immediately adjacent ones of the gate segments is ≈1.0 CPP, where CPP is a unit of distance-measure; and a size of the first AR-gap, G1, between the first & second ARs is (≈1.5 CPP)≤G1; and a size of the second AR-gap, G2, between the third & fourth ARs is (≈1.5 CPP)≤G2.

In some embodiments, the size of the first AR-gap, G1, between the first & second ARs is (≈2.0 CPP)≤G1; and the size of the second AR-gap, G2, between the third & fourth ARs is (≈2.0 CPP)≤G2. In some embodiments, the size of the first AR-gap, G1, between the first & second ARs is (≈3.0 CPP)≤G1; and the size of the second AR-gap, G2, between the third & fourth ARs is (≈3.0 CPP)≤G2. In some embodiments, a configuration (A) or a configuration (B) is true; for the configuration (A), the first gate segment is over the first AR-gap and the second gate segment is over the second AR, and the first gate segment is over the third AR and the second gate segment is over the second AR-gap; and for the configuration (B), the first gate segment is over the first AR and the second gate segment is over the first AR-gap, and the first gate segment is over the second AR-gap and the second gate segment is over the fourth AR. In some embodiments, a configuration (A) or a configuration (B) is true; for the configuration (A), the first gate segment is over the first AR-gap, and the second gate segment is over the second AR-gap; and, for the configuration (B), the second gate segment is over the first AR-gap, and the first gate segment is over the second AR-gap; relative to the first direction, seventh & eighth and ninth & tenth ones of the gate segments are correspondingly coaxial and separated by corresponding gate-gaps located centrally in the filler cell region; relative to the second direction, the first and second gate segments, the third & fourth gate segments and the fifth & sixth gate segments being between the seventh & eighth and ninth & tenth gate segments; the third & fourth gate segments are correspondingly over the first and third ARs; and the seventh & eighth gate segments are correspondingly over the first and third ARs; the fifth & sixth gate segments are correspondingly over the second and fourth ARs; and the ninth & tenth gate segments are correspondingly over the second and fourth ARs. In some embodiments, each of the first and second gate segments is over the first AR-gap; and each of the first and second gate segments is over the second AR-gap. In some embodiments, the filler cell region further includes: active regions (ARs) extending in the second direction; and wherein, relative to the second direction, first and second ones of the ARs extending continuously across the filler cell region.

In some embodiments, the filler cell region further includes: active regions (ARs) extending in the second direction; relative to the second direction, first & second and third & fourth ones of the ARs being correspondingly coaxial and separated by corresponding first and second AR-gaps located centrally in the filler cell region; and, wherein, relative to the second direction: a distance between two immediately adjacent ones of the gate segments is ≈1.0 CPP, where CPP is a unit of distance-measure; at least one of the first or second ARs extends toward a central area of the filler cell region and terminates in a corresponding first end which is separated from a corresponding one of the first & second gate segments by at least a corresponding AR-gap having a first size (first-size AR-gap), the first size being ≈0.5 CPP; and at least one of the third or fourth ARs extends toward the central area of the filler cell region and terminates in a corresponding first end which is separated from a corresponding one of the first & second gate segments by at least a corresponding first-size AR-gap. In some embodiments, relative to the second direction: the first end correspondingly of each of the first and second ARs is separated from the corresponding one of the first & second gate segments by a corresponding first-size AR-gap; and the first end correspondingly of each of the third and fourth ARs is separated from the corresponding one of the first & second gate segments by a corresponding first-size AR-gap.

In some embodiments, a filler cell region (in a semiconductor device) includes: gate segments extending in a first direction and being free from electrical coupling to active or passive circuitry within the filler cell region. Relative to the first direction: a majority of first ends of the gate segments substantially aligning with a first reference line extending in a second direction perpendicular to the first direction, the first reference line being parallel and proximal to a top boundary of the filler cell region; a majority of second ends of the gate segments substantially aligning with a second reference line extending in the second direction and being parallel and proximal to a bottom boundary of the filler cell region; first and second ones of the gate segments extending continuously across the filler cell region; and third & fourth and fifth & sixth ones of the gate segments being correspondingly coaxial and separated by corresponding gate-gaps located centrally in the filler cell region. Relative to the second direction, the first and second gate segments being between the third & fourth gate segments and the fifth & sixth gate segments. Also relative to the first direction: a first end of the first gate segment extending to the top boundary; and a second end of the second gate segment extending to the bottom boundary. At least additional four ones of the gate segments other than the first to sixth gate segments being arranged as pairs of dyads of gate segments, gate-segment-members of each dyad being coaxial and separated by a corresponding gate-gap relative to the first direction. Also relative to the second direction, the first and second gate segments, the third & fourth gate segments and the fifth & sixth gate segments being between each pair of dyads.

In some embodiments, each dyad of gate segments includes an upper gate segment and a lower gate segment; each pair of dyads includes a left dyad and a right dyad; the third gate segment and each upper gate segment of each left dyad of gate segments is over the first AR; the fourth gate segment and each lower gate segment of each left dyad of gate segments is over the third AR; the fifth gate segment and each upper gate segment of each right dyad of gate segments is over the second AR; and the sixth gate segment and each lower gate segment of each right dyad of gate segments is over the fourth AR.

In some embodiments, a method (of forming a filler cell region of a semiconductor device) includes forming active regions (ARs) including doping areas of a substrate, the ARs extending in a first direction; and relative to the first direction, the forming ARs resulting in first & second and third & fourth ones of the ARs being correspondingly coaxial and separated by corresponding first and second AR-gaps located centrally in the filler cell region. The method further includes forming gate segments extending in a second direction perpendicular to the first direction, the forming gate segments resulting in the gate segments being free from electrical coupling to active or passive circuitry within the filler cell region, and relative to the second direction: a majority of first ends of the gate segments substantially aligning with a first reference line extending in the first direction, the first reference line being parallel and proximal to a top boundary of the filler cell region; a majority of second ends of the gate segments substantially aligning with a second reference line extending in the first direction and being parallel and proximal to a bottom boundary of the filler cell region; first and second ones of the gate segments extending continuously across the filler cell region; and third & fourth and fifth & sixth ones of the gate segments being correspondingly coaxial and separated by corresponding gate-gaps located centrally in the filler cell region. Relative to the first direction, the first and second gate segments being between the third & fourth gate segments and the fifth & sixth gate segments. Relative to the second direction: a first end of the first gate segment extending to the top boundary; and a second end of the second gate segment extending to the bottom boundary.

In some embodiments, the forming gate segments further results in the first and second gate segments being the same. In some embodiments, the forming gate segments results in: relative to the first direction, a seventh one of the gate segments being between the third & fourth gate segments and the fifth & sixth gate segments; and relative to the second direction, a first end of the seventh gate segment substantially aligning with the first reference line, and a second end of the seventh gate segment substantially aligning with the second reference line. In some embodiments, the forming gate segments further results in, relative to the second direction: a second end of the first gate segment substantially aligning with the second reference line; and a first end of the second gate segment substantially aligning with the first reference line.

In some embodiments, the forming gate segments results in relative to the first direction, a distance between two immediately adjacent ones of the gate segments being $\approx 1.0$ CPP, where CPP is a unit of distance-measure; and the forming ARs further results in a size of the first AR-gap, G1, between the first & second ARs is $(\approx 1.5$ CPP$) \leq$ G1, and a size of the second AR-gap, G2, between the third & fourth ARs is $(\approx 1.5$ CPP$) \leq$ G2.

In some embodiments, the forming gate segments results in a configuration (A) or a configuration (B) being true; for the configuration (A), the first gate segment is over the first AR-gap and the second gate segment is over the second AR, and the first gate segment is over the third AR and the second gate segment is over the second AR-gap; and for the configuration (B), the first gate segment is over the first AR and the second gate segment is over the first AR-gap; and the first gate segment is over the second AR-gap and the second gate segment is over the fourth AR. In some embodiments, a configuration (A) or a configuration (B) being true; for the configuration (A), the first gate segment is over the first AR-gap, and the second gate segment is over the second AR-gap; and for the configuration (B), the second gate segment is over the first AR-gap, and the first gate segment is over the second AR-gap; and the forming gate segments results in relative to the second direction, seventh & eighth and ninth & tenth ones of the gate segments are correspondingly coaxial and separated by corresponding gate-gaps located centrally in the filler cell region, relative to the first direction, the first and second gate segments, the third & fourth gate segments and the fifth & sixth gate segments being between the seventh & eighth and ninth & tenth gate segments; the third & fourth and seventh & eighth gate segments are correspondingly over the first and third ARs; and the fifth & sixth and ninth & tenth gate segments are correspondingly over the second and fourth ARs.

In some embodiments, the forming ARs further results in: the size of the first AR-gap, G1, between the first & second ARs being $(\approx 2.0$ CPP$) \leq$ G1; and the size of the second AR-gap, G2, between the third & fourth ARs being $(\approx 2.0$ CPP$) \leq$ G2. In some embodiments, the forming ARs further results in: the size of the first AR-gap, G1, between the first & second ARs being $(\approx 3.0$ CPP$) \leq$ G1; and the size of the second AR-gap, G2, between the third & fourth ARs being $(\approx 3.0$ CPP$) \leq$ G2.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A filler cell region in a semiconductor device, the filler cell region comprising:
    gate segments extending in a first direction and being free from electrical coupling to active or passive circuitry within the filler cell region;
    relative to the first direction:
        a majority of first ends of the gate segments substantially aligning with a first reference line extending in a second direction perpendicular to the first direction, the first reference line being parallel and proximal to a top boundary of the filler cell region;
        a majority of second ends of the gate segments substantially aligning with a second reference line extending in the second direction and being parallel and proximal to a bottom boundary of the filler cell region;
        first and second ones of the gate segments extending continuously across the filler cell region; and
        third & fourth and fifth & sixth ones of the gate segments being correspondingly coaxial and separated by corresponding gate-gaps located centrally in the filler cell region;
    relative to the second direction, the first and second gate segments being between the third & fourth gate segments and the fifth & sixth gate segments; and
    relative to the first direction:
        a first end of the first gate segment extending to the top boundary; and
        a second end of the second gate segment extending to the bottom boundary.

2. The filler cell region of claim 1, wherein:
the first and second gate segments are the same.

3. The filler cell region of claim 2, wherein:
relative to the second direction, a seventh one of the gate segments is between the third & fourth gate segments and the fifth & sixth gate segments; and
relative to the first direction:
- a first end of the seventh gate segment substantially aligns with the first reference line; and
- a second end of the seventh gate segment substantially aligns with the second reference line.

4. The filler cell region of claim 1, wherein:
relative to the first direction:
- a second end of the first gate segment substantially aligns with the second reference line; and
- a first end of the second gate segment substantially aligns with the first reference line.

5. The filler cell region of claim 1, further comprising:
active regions (ARs) extending in the second direction;
relative to the second direction, first & second and third & fourth ones of the ARs being correspondingly coaxial and separated by corresponding first and second AR-gaps located centrally in the filler cell region; and
wherein:
relative to the second direction:
- a distance between two immediately adjacent ones of the gate segments is $\approx 1.0$ CPP, where CPP is a unit of distance-measure;
- a size of the first AR-gap, G1, between the first & second ARs is $(\approx 1.5$ CPP$) \leq G1$; and
- a size of the second AR-gap, G2, between the third & fourth ARs is $(\approx 1.5$ CPP$) \leq G2$.

6. The filler cell region of claim 5, wherein:
the size of the first AR-gap, G1, between the first & second ARs is $(\approx 2.0$ CPP$) \leq G1$; and
the size of the second AR-gap, G2, between the third & fourth ARs is $(\approx 2.0$ CPP$) \leq G2$.

7. The filler cell region of claim 6, wherein:
the size of the first AR-gap, G1, between the first & second ARs is $(\approx 3.0$ CPP$) \leq G1$; and
the size of the second AR-gap, G2, between the third & fourth ARs is $(\approx 3.0$ CPP$) \leq G2$.

8. The filler cell region of claim 5, wherein:
a configuration (A) or a configuration (B) is true;
for the configuration (A):
- the first gate segment is over the first AR-gap and the second gate segment is over the second AR; and
- the first gate segment is over the third AR and the second gate segment is over the second AR-gap; and
for the configuration (B):
- the first gate segment is over the first AR and the second gate segment is over the first AR-gap; and
- the first gate segment is over the second AR-gap and the second gate segment is over the fourth AR.

9. The filler cell region of claim 5, wherein:
a configuration (A) or a configuration (B) is true;
for the configuration (A):
- the first gate segment is over the first AR-gap; and
- the second gate segment is over the second AR-gap; and
for the configuration (B):
- the second gate segment is over the first AR-gap; and
- the first gate segment is over the second AR-gap;
relative to the first direction, seventh & eighth and ninth & tenth ones of the gate segments are correspondingly coaxial and separated by corresponding gate-gaps located centrally in the filler cell region;
relative to the second direction, the first and second gate segments, the third & fourth gate segments and the fifth & sixth gate segments being between the seventh & eighth and ninth & tenth gate segments;
the third & fourth gate segments are correspondingly over the first and third ARs;
the seventh & eighth gate segments are correspondingly over the first and third ARs;
the fifth & sixth gate segments are correspondingly over the second and fourth ARs; and
the ninth & tenth gate segments are correspondingly over the second and fourth ARs.

10. The filler cell region of claim 5, wherein:
each of the first and second gate segments is over the first AR-gap; and
each of the first and second gate segments is over the second AR-gap.

11. The filler cell region of claim 1, further comprising:
active regions (ARs) extending in the second direction; and
wherein, relative to the second direction, first and second ones of the ARs extend continuously across the filler cell region.

12. A filler cell region in a semiconductor device, the filler cell region comprising:
gate segments extending in a first direction and being free from electrical coupling to active or passive circuitry within the filler cell region;
relative to the first direction:
- a majority of first ends of the gate segments substantially aligning with a first reference line extending in a second direction perpendicular to the first direction, the first reference line being parallel and proximal to a top boundary of the filler cell region;
- a majority of second ends of the gate segments substantially aligning with a second reference line extending in the second direction and being parallel and proximal to a bottom boundary of the filler cell region;
- first and second ones of the gate segments extending continuously across the filler cell region; and
- third & fourth and fifth & sixth ones of the gate segments being correspondingly coaxial and separated by corresponding gate-gaps located centrally in the filler cell region;
relative to the second direction, the first and second gate segments being between the third & fourth gate segments and the fifth & sixth gate segments;
relative to the first direction:
- a first end of the first gate segment extending to the top boundary; and
- a second end of the second gate segment extending to the bottom boundary;
at least additional four ones of the gate segments other than the first to sixth gate segments being arranged as pairs of dyads of gate segments, gate-segment-members of each dyad being coaxial and separated by a corresponding gate-gap relative to the first direction; and
relative to the second direction, the first and second gate segments, the third & fourth gate segments and the fifth & sixth gate segments being between each pair of dyads.

13. The filler cell region of claim 12, wherein:
each dyad of gate segments includes an upper gate segment and a lower gate segment;
each pair of dyads includes a left dyad and a right dyad;
the third gate segment and each upper gate segment of each left dyad of gate segments is over the first AR;
the fourth gate segment and each lower gate segment of each left dyad of gate segments is over the third AR;
the fifth gate segment and each upper gate segment of each right dyad of gate segments is over the second AR; and
the sixth gate segment and each lower gate segment of each right dyad of gate segments is over the fourth AR.

14. A method of forming a filler cell region of a semiconductor device, the method comprising:
forming active regions (ARs) including doping areas of a substrate, the ARs extending in a first direction;
relative to the first direction, the forming ARs resulting in first & second and third & fourth ones of the ARs being correspondingly coaxial and separated by corresponding first and second AR-gaps located centrally in the filler cell region; and
forming gate segments extending in a second direction perpendicular to the first direction, the forming gate segments resulting in:
the gate segments being free from electrical coupling to active or passive circuitry within the filler cell region; and
relative to the second direction:
a majority of first ends of the gate segments substantially aligning with a first reference line extending in the first direction, the first reference line being parallel and proximal to a top boundary of the filler cell region;
a majority of second ends of the gate segments substantially aligning with a second reference line extending in the first direction and being parallel and proximal to a bottom boundary of the filler cell region;
first and second ones of the gate segments extending continuously across the filler cell region; and
third & fourth and fifth & sixth ones of the gate segments being correspondingly coaxial and separated by corresponding gate-gaps located centrally in the filler cell region;
relative to the first direction, the first and second gate segments being between the third & fourth gate segments and the fifth & sixth gate segments; and
relative to the second direction:
a first end of the first gate segment extending to the top boundary; and
a second end of the second gate segment extending to the bottom boundary.

15. The method of claim 14, wherein the forming gate segments further results in:
the first and second gate segments being the same.

16. The method of claim 15, wherein the forming gate segments further results in:
relative to the first direction, a seventh one of the gate segments being between the third & fourth gate segments and the fifth & sixth gate segments; and
relative to the second direction:
a first end of the seventh gate segment substantially aligning with the first reference line; and
a second end of the seventh gate segment substantially aligning with the second reference line.

17. The method of claim 14, wherein the forming gate segments further results in:
relative to the second direction:
a second end of the first gate segment substantially aligning with the second reference line; and
a first end of the second gate segment substantially aligning with the first reference line.

18. The method of claim 14, wherein:
the forming gate segments further results in:
relative to the first direction, a distance between two immediately adjacent ones of the gate segments being ≈1.0 CPP, where CPP is a unit of distance-measure; and
the forming ARs further results in:
a size of the first AR-gap, G1, between the first & second ARs is (≈1.5 CPP)≤G1; and
a size of the second AR-gap, G2, between the third & fourth ARs is (≈1.5 CPP)≤G2.

19. The method of claim 18, wherein:
the forming gate segments further results in a configuration (A) or a configuration (B) being true;
for the configuration (A):
the first gate segment is over the first AR-gap and the second gate segment is over the second AR; and
the first gate segment is over the third AR and the second gate segment is over the second AR-gap; and
for the configuration (B):
the first gate segment is over the first AR and the second gate segment is over the first AR-gap; and
the first gate segment is over the second AR-gap and the second gate segment is over the fourth AR.

20. The method of claim 18, wherein:
a configuration (A) or a configuration (B) being true;
for the configuration (A):
the first gate segment is over the first AR-gap; and
the second gate segment is over the second AR-gap; and
for the configuration (B):
the second gate segment is over the first AR-gap; and
the first gate segment is over the second AR-gap;
the forming gate segments results in:
relative to the second direction, seventh & eighth and ninth & tenth ones of the gate segments are correspondingly coaxial and separated by corresponding gate-gaps located centrally in the filler cell region;
relative to the first direction, the first and second gate segments, the third & fourth gate segments and the fifth & sixth gate segments being between the seventh & eighth and ninth & tenth gate segments;
the third & fourth and seventh & eighth gate segments are correspondingly over the first and third ARs; and
the fifth & sixth and ninth & tenth gate segments are correspondingly over the second and fourth ARs.

* * * * *